United States Patent
Lee et al.

(10) Patent No.: US 9,893,051 B2
(45) Date of Patent: Feb. 13, 2018

(54) LED CHIP HAVING ESD PROTECTION

(71) Applicant: SEOUL VIOSYS CO., LTD., Ansan-si (KR)

(72) Inventors: Seom Geun Lee, Ansan-si (KR); Yeo Jin Yoon, Ansan-si (KR); Jae Kwon Kim, Ansan-si (KR); So Ra Lee, Ansan-si (KR); Myoung Hak Yang, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/991,829

(22) PCT Filed: Jul. 10, 2014

(86) PCT No.: PCT/KR2014/006222
§ 371 (c)(1),
(2) Date: Jan. 8, 2016

(87) PCT Pub. No.: WO2015/005706
PCT Pub. Date: Jan. 15, 2015

(65) Prior Publication Data
US 2016/0218096 A1    Jul. 28, 2016

(30) Foreign Application Priority Data
Jul. 10, 2013   (KR) .................. 10-2013-0081118

(51) Int. Cl.
*H01L 27/02* (2006.01)
*H01L 33/62* (2010.01)
(Continued)

(52) U.S. Cl.
CPC ........ *H01L 27/0255* (2013.01); *H01L 25/167* (2013.01); *H01L 27/15* (2013.01);
(Continued)

(58) Field of Classification Search
CPC ..... H01L 33/405; H01L 33/44; H01L 25/167; H01L 27/0255
(Continued)

(56) References Cited

U.S. PATENT DOCUMENTS 7,897,497 B2    3/2011    Kamii et al.
2002/0179914 A1*  12/2002  Sheu .................. H01L 25/167
                                                        257/90

FOREIGN PATENT DOCUMENTS

CN       1750277 B     11/2010
JP       2006066845     3/2006
(Continued)

OTHER PUBLICATIONS

Park, H.L., Authorized Officer, Korean Intellectual Property Office, International Application No. PCT/KR2014/006222, Nov. 25, 2014, 3 pages.
(Continued)

*Primary Examiner* — Bo Fan
(74) *Attorney, Agent, or Firm* — Perkins Coie LLP

(57) ABSTRACT

Disclosed herein is a light emitting diode chip having ESD protection. An exemplary embodiment provides a flip-chip type light emitting diode chip, which includes a light emitting diode part aligned on a substrate, and a reverse-parallel diode part disposed on the substrate and connected to the light emitting diode part. Within the flip-chip type light emitting diode chip, the light emitting diode part is placed together with reverse-parallel diode part, thereby providing a light emitting diode chip exhibiting strong resistance to electrostatic discharge.

15 Claims, 24 Drawing Sheets

(51) Int. Cl.
   *H01L 27/15*    (2006.01)
   *H01L 33/40*    (2010.01)
   *H01L 25/16*    (2006.01)
   *H01L 33/06*    (2010.01)
   *H01L 33/32*    (2010.01)
   *H01L 33/44*    (2010.01)

(52) U.S. Cl.
   CPC .............. *H01L 33/06* (2013.01); *H01L 33/32* (2013.01); *H01L 33/405* (2013.01); *H01L 33/62* (2013.01); *H01L 33/44* (2013.01); *H01L 2924/0002* (2013.01)

(58) Field of Classification Search
   USPC .......................... 257/767, 737; 438/703, 614
   See application file for complete search history.

(56) References Cited

FOREIGN PATENT DOCUMENTS

| KR | 1020010088929 A | 9/2001 |
| KR | 101087968 B1 | 12/2011 |
| KR | 1020130017661 A | 2/2013 |

OTHER PUBLICATIONS

First Office Action in Chinese Patent Application No. 201480049884.8, dated Jul. 3, 2017.

\* cited by examiner (a)

(b)

(a)

(b)

(a)

(b)

(a)

(b)

(a)

(a)

(b)

(a)

(b)

LED CHIP HAVING ESD PROTECTION

CROSS REFERENCE TO RELATED APPLICATION

This application is a continuation application, under 35 USC 120, of the PCT Application No. PCT/KR2014/006222 filed on Jul. 10, 2014, which further claims priority to Korean Application No. 10-2013-0081118 filed on Jul. 10, 2013. The disclosures of the above referenced applications are incorporated by reference as part of this application.

TECHNICAL FIELD

This patent document relates to a light emitting device. Some implementations of the disclosed technology relate to a light emitting diode chip having electrostatic discharge protection.

BACKGROUND

Generally, GaN-based compound semiconductors are grown on a sapphire substrate, the crystal structure and lattice parameter of which are similar to those of the semiconductors, by epitaxial growth in order to reduce crystal defects. However, the epitaxial layers grown on the sapphire substrate contain many crystal defects such as V-pits, threading dislocations, and the like. When static electricity of high voltage is applied to the epitaxial layers, current is concentrated on crystal defects in the epitaxial layers, thereby promoting breakdown of a diode.

Recently, application of high brightness-high output light emitting diodes (LEDs) is increasing from backlight units of LED TVs to luminaires, automobiles, electric display boards, facilities, and the like. Thus, further improved electrostatic discharge (ESD) protection for light emitting devices is required in the art.

SUMMARY

This patent document discloses a light emitting diode chip having electrostatic discharge protection.

In one aspect, a flip-chip type light emitting diode chip is provided to include: a substrate; a light emitting diode part aligned on the substrate; and a reverse-parallel diode part disposed on the substrate and connected to the light emitting diode part. The light emitting diode part can be protected from electrostatic discharge by the reverse-parallel diode part.

The flip-chip type light emitting diode chip may further include a first electrode pad and a second electrode pad. The first electrode pad may be aligned on the light emitting diode part and the second electrode pad may be aligned over the light emitting diode part and the reverse-parallel diode part. In some implementations, each of the light emitting diode part and the reverse-parallel diode part may include a first conductive type nitride-based semiconductor layer; a second conductive type nitride-based semiconductor layer; and an active layer placed between the first conductive type nitride-based semiconductor layer and the second conductive type nitride-based semiconductor layer.

In some implementations, the first electrode pad may be electrically connected to the first conductive type semiconductor layer of the light emitting diode part and the second conductive type semiconductor layer of the reverse-parallel diode part. On the other hand, the second electrode pad may be electrically connected to the second conductive type semiconductor layer of the light emitting diode part and the first conductive type semiconductor layer of the reverse-parallel diode part. The flip-chip type light emitting diode chip may further include a reflective electrode aligned on second conductive type nitride-based semiconductor layer of the light emitting diode part, and the first electrode pad may be placed on the reflective electrode.

The flip-chip type light emitting diode chip may further include a current dispersion layer placed between the reflective electrode and the first electrode pad, and electrically connected to the first conductive type nitride-based semiconductor layer of the light emitting diode part and the second conductive type nitride-based semiconductor layer of the reverse-parallel diode part. The current dispersion layer is insulated from the reflective electrode. In some implementations, the current dispersion layer may cover the light emitting diode part and the reverse-parallel diode part, and may have an opening which exposes the reflective electrode on the light emitting diode part, and an opening which exposes the first conductive type nitride-based semiconductor layer of the reverse-parallel diode part. The reflective electrode and the first conductive type nitride-based semiconductor layer exposed through the openings of the current dispersion layer may be electrically connected to each other by the second electrode pad.

In some embodiments, the reverse-parallel diode part may include two diodes connected in opposite directions. In addition, the two diodes may share cathodes. The flip-chip type light emitting diode chip may further include a first electrode pad and a second electrode pad. Here, the first electrode pad may be aligned on the light emitting diode part and the second electrode pad may be aligned over the light emitting diode part and the reverse-parallel diode part. In some implementations, each of the light emitting diode part and the reverse-parallel diode part may include a first conductive type nitride-based semiconductor layer; a second conductive type nitride-based semiconductor layer; and an active layer placed between the first conductive type nitride-based semiconductor layer and the second conductive type nitride-based semiconductor layer. In some implementations, the first electrode pad may be electrically connected to the first conductive type semiconductor layer of the light emitting diode part and the second conductive type semiconductor layer of one of the two diodes. In some implementations, the second electrode pad may be electrically connected to the second conductive type semiconductor layer of the light emitting diode part and the second conductive type semiconductor layer of the other diode.

In another aspect, a light emitting diode chip is provided to include: a light emitting diode part; a reverse-parallel diode part to protect the light emitting diode part from electrostatic discharge; a first electrode pad aligned on the light emitting diode part; and a second electrode pad placed over the light emitting diode part and the reverse-parallel diode part. Since the second electrode pad is placed over the light emitting diode part and the reverse-parallel diode part, the size of the reverse-parallel diode part may be relatively freely adjusted without being limited by the second electrode pad.

In some embodiments, the first electrode pad may be electrically connected to a cathode of the light emitting diode part and an anode of the reverse-parallel diode part, and the second electrode pad may be electrically connected to an anode of the light emitting diode part and a cathode of the reverse-parallel diode part. In some embodiments, the reverse-parallel diode part may include two diodes connected in opposite directions. The two diodes may share a cathode. In some implementations, the reverse-parallel diode part is located in the middle of an edge of the substrate. In some implementations, the light emitting diode part is formed to surround at least a portion of the reverse-parallel diode part. In some implementations, the reverse-parallel diode part has a polygonal shape having four sides and the light emitting diode part surrounds three sides of the reverse-parallel diode part.

In another aspect, a light emitting diode chip is provided to include: a light emitting diode part; a reverse-parallel diode part; a reflective electrode; and a current dispersion layer, wherein each of the light emitting diode part and the reverse-parallel diode part includes a first conductive type nitride-based semiconductor layer, an active layer and a second conductive type nitride-based semiconductor layer; the reflective electrode is aligned on the second conductive type nitride-based semiconductor layer of the light emitting diode part; and the current dispersion layer covers the light emitting diode part and the reverse-parallel diode part to electrically connect the first conductive type semiconductor layer of the light emitting diode part to the second conductive type semiconductor layer of the reverse-parallel diode part, is insulated from the reflective electrode on the light emitting diode part, and includes an opening which exposes the reflective electrode.

In some implementations, the current dispersion layer may further include an opening which exposes the first conductive type semiconductor layer of the reverse-parallel diode part. In some implementations, the reverse-parallel diode part is located in the middle of an edge of the substrate. In some implementations, the light emitting diode part is formed to surround at least a portion of the reverse-parallel diode part. In some implementations, the reverse-parallel diode part has a polygonal shape having four sides and the light emitting diode part surrounds three sides of the reverse-parallel diode part. In some embodiments, the reverse-parallel diode part may include two diodes connected in opposite directions, and the current dispersion layer may cover the second conductive type semiconductor layer of one of the two diodes and may have an opening which exposes the second conductive type semiconductor layer of the other diode. In some implementations, the reverse-parallel diode part is located in the middle of an edge of the substrate. In some implementations, the light emitting diode part is formed to surround at least a portion of the reverse-parallel diode part. In some implementations, the reverse-parallel diode part has a polygonal shape having four sides and the light emitting diode part surrounds three sides of the reverse-parallel diode part.

In another aspect, a flip-chip type light emitting diode chip is provided to comprise: a substrate; a light emitting diode part aligned on the substrate; a reverse-parallel diode part aligned on the substrate and connected to the light emitting diode part; a first electrode pad aligned on the light emitting diode part; and a second electrode pad aligned over the light emitting diode part and the reverse-parallel diode part, wherein each of the light emitting diode part and the reverse-parallel diode part comprises; a first conductive type nitride-based semiconductor layer; a second conductive type nitride-based semiconductor layer; and an active layer placed between the first conductive type nitride-based semiconductor layer and the second conductive type nitride-based semiconductor layer, and wherein the first electrode pad is electrically connected to the first conductive type semiconductor layer of the light emitting diode part and the second conductive type semiconductor layer of the reverse-parallel diode part.

In some implementations, the reverse-parallel diode part is located in the middle of an edge of the substrate. In some implementations, the light emitting diode part is formed to surround at least a portion of the reverse-parallel diode part. In some implementations, the reverse-parallel diode part has a polygonal shape having four sides and the light emitting diode part surrounds three sides of the reverse-parallel diode part.

BRIEF DESCRIPTIONS OF DRAWINGS

DETAILED DESCRIPTION

Figure 1A:
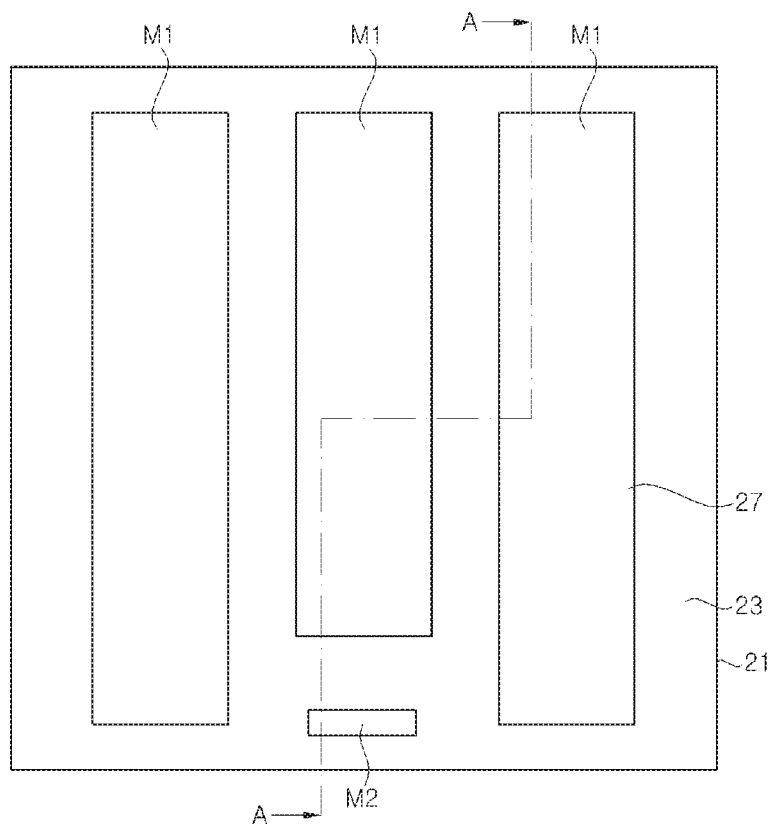
FIG. 1 to FIG. 7 are schematic plan views and sectional views illustrating a light emitting diode chip and a method of fabricating the same according to an exemplary embodiment of the disclosed technology.

It is necessary for LEDs to secure semi-permanent lifespan using an ESD protection device having excellent electrical reliability. It is also important to secure reliability of LEDs with respect to electrostatic discharge, electrical fast transient (EFT) which is a spark generated in a switch, and lightning surge in air.

Generally, in packaging of a light emitting diode, a separate Zener diode is mounted together with the light emitting diode to prevent electrostatic discharge. For example, Korean Patent Publication No. 10-2011-0128592 and others discuss the related technology. However, the Zener diode is expensive and a process of mounting the Zener diode increases the number of processes for packaging the light emitting diode and manufacturing costs. Moreover, since the Zener diode is placed near the light emitting diode in the LED package, the LED package has deteriorated luminous efficacy due to absorption of light by the Zener diode, thereby deteriorating LED package yield.

Hereinafter, exemplary embodiments of the disclosed technology will be described in detail with reference to the accompanying drawings. It should be understood that the following descriptions are provided to facilitate the understanding of various implementations of the disclosed technology and the disclosed technology is not limited to the following embodiments and may be embodied in different ways. In addition, in the drawings, the width, length and thickness of components may be exaggerated for convenience. Further, it should be noted that the drawings are not to precise scale. Like components will be denoted by like reference numerals throughout the specification.

To provide better understanding of the light emitting diode chip according to the embodiments of the disclosed technology, a method of fabricating a light emitting diode chip will be described hereinafter. However, it should be understood that the disclosed technology is not limited to a light emitting diode chip fabricated by a certain fabrication method and the following fabrication method is provided for better understanding of the light emitting diode chip according to the disclosed technology.

FIG. 1 to FIG. 7 are views illustrating a method of fabricating a light emitting diode chip according to an exemplary embodiment of the disclosed technology. Here, (a) is a plan view and (b) is a cross-sectional view taken along line A-A.

Figure 1B:
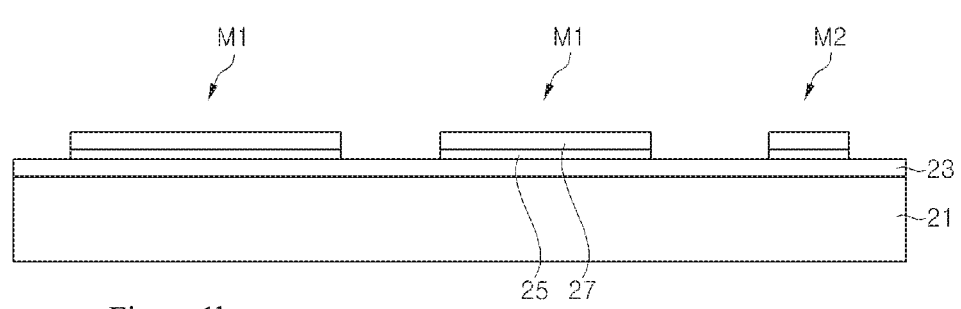

First, referring to FIG. 1, a first conductive type semiconductor layer 23 is formed on a substrate 21, and a plurality of mesas M1 and M2 are formed on the first conductive type semiconductor layer 23 to be separated from each other. Each of the mesas M1 and M2 includes an active layer 25 and a second conductive type semiconductor layer 27. The active layer 25 is placed between the first conductive type semiconductor layer 23 and the second conductive type semiconductor layer 27.

The plurality of mesas M1 and M2 may be formed by growing epitaxial layers including the first conductive type semiconductor layer 23, the active layer 25 and the second conductive type semiconductor layer 27 on the substrate 21 by metal organic chemical vapor growth or the like, followed by patterning the second conductive type semiconductor layer 27 and the active layer 25 so as to expose the first conductive type semiconductor layer 23. The first conductive type semiconductor layer 23, the active layer 25 and the second conductive type semiconductor layer 27 may be or include nitride-based semiconductor layers such as gallium nitride semiconductor layers. In addition, the plurality of mesas M1 and M2 may have slanted side surfaces formed by photoresist reflow. The slanted profile of the side surface of the mesas M1 enhances light extraction efficiency from the active layer 25.

The plurality of mesas M1 may have an elongated shape extending in one direction to be parallel to each other, as shown in the drawings. Such a shape simplifies a formation of the plural mesas M1 having the same shape in a plurality of chip areas on the substrate 21. However, the mesas M1 need not to be formed in plural and a single mesa M1 may also be formed. In some implementations, the mesa M2 has a smaller size than the mesas M1.

Figure 2A:
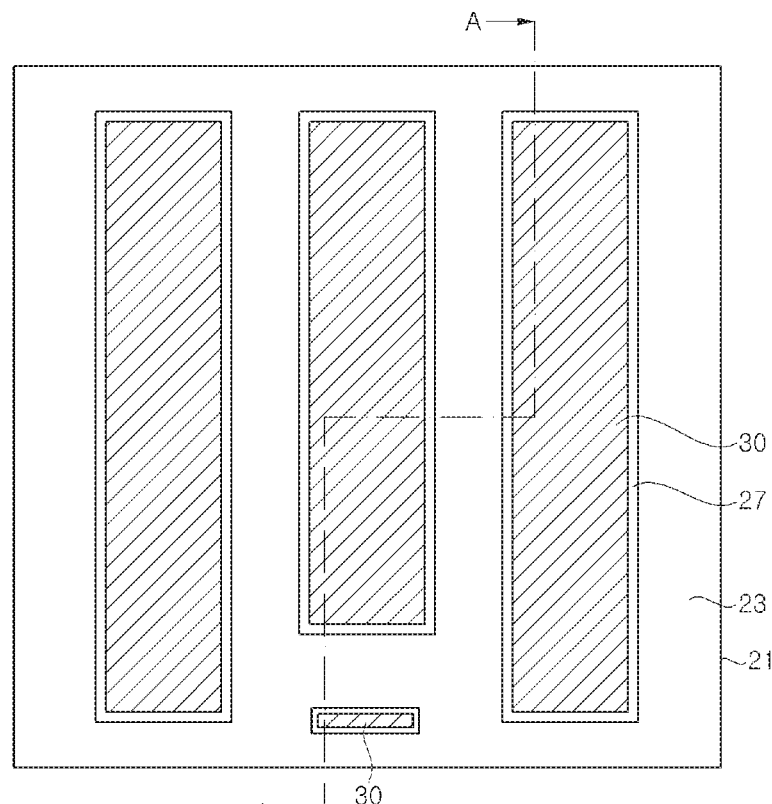
Figure 2B:
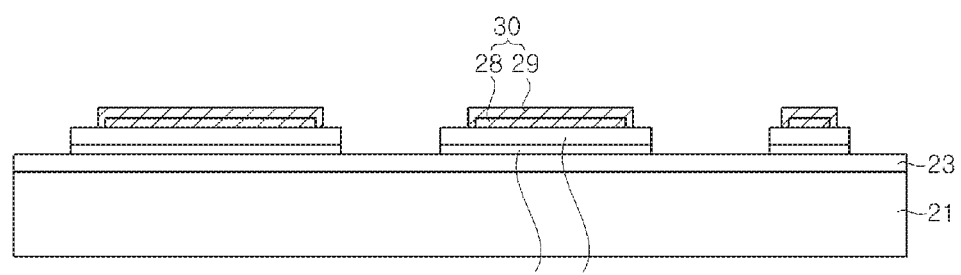

Referring to FIG. 2, a reflective electrode 30 is formed on each of the mesas M1 and M2. The reflective electrodes 30 may be formed on the mesas M1 and M2 after the mesas M1 and M2 are formed, without being limited thereto. For example, the reflective electrodes 30 may be formed on the second conductive type semiconductor layer 27 after the second conductive type semiconductor layer 27 is grown and before the mesas M1 and M2 are formed. The reflective electrodes 30 cover substantially the entirety of upper surfaces of the mesas M1 and M2 and have substantially the same shape as the mesas M1 and M2 in top view. In this embodiment, the reflective electrode 30 is illustrated as being formed on the mesa M2. However, the reflective electrode on the mesa M2 can be omitted, and an ohmic metal layer instead of the reflective electrode 30 may be formed on the mesa M2.

The reflective electrode 30 may include a reflective layer 28 and may further include a barrier layer 29. The barrier layer 29 may cover an upper surface and side surfaces of the reflective layer 28. For example, a pattern of the reflective layer 28 is formed and the barrier layer 29 is formed thereon, whereby the barrier layer 29 can be formed to cover the upper and side surfaces of the reflective layer 28. For example, the reflective layer 28 may be formed through deposition and patterning or a lift-off process of Ag, Ag alloy, Ni/Ag, NiZn/Ag, or TiO/Ag layers. The barrier layer 29 may be formed of or include Ni, Cr, Ti, Pt, Au or combinations thereof, and prevents diffusion or contamination of metallic materials of the reflective layer.

Figure 3A:
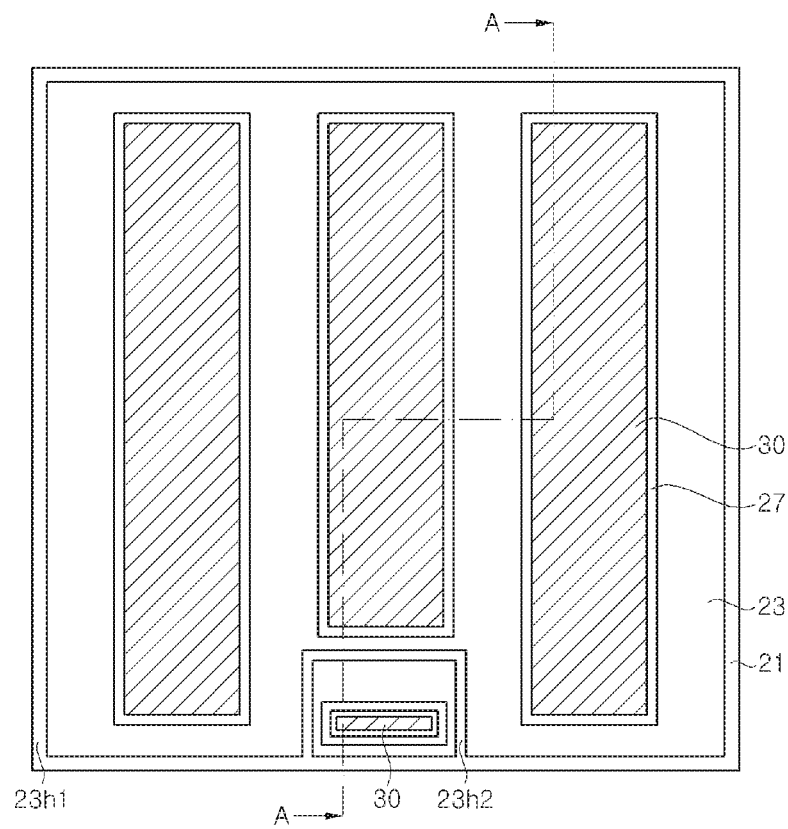
Figure 3B:
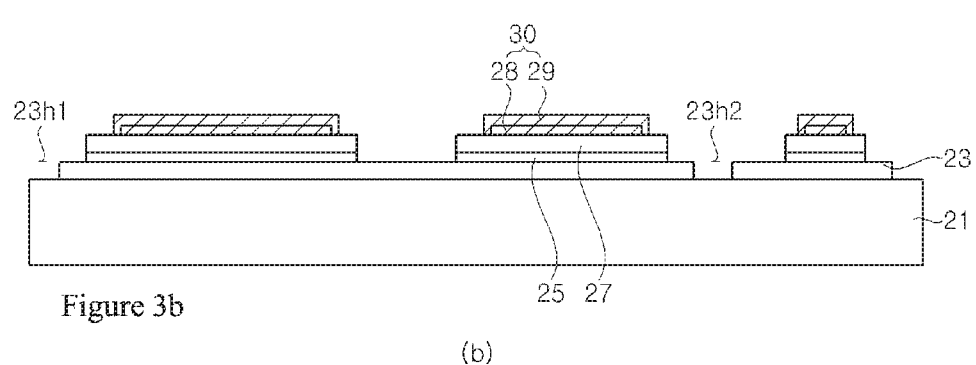

Referring to FIG. 3, a process of isolating light emitting diode chip areas on the substrate 21 from one another is performed to form an insolation trench 23$h$1 which defines the chip areas. At this time, the isolation trenches 23$h$2 are also formed to isolate the mesas M1 and the mesa M2 from one another. The isolation process may be performed by photolithography and etching.

The isolation trenches 23$h$1 and 23$h$2 may have slanted side surfaces. In addition, the upper surface of the substrate 21 may be exposed through the isolation trenches 23$h$1 and 23$h$2. The isolation trench 23$h$1 isolates the chip area from other chip areas and the isolation trench 23$h$2 separates the light emitting diode part from the reverse-parallel diode part, as described below. In other words, the isolation trench 23$h$2 divides the first conductive type semiconductor layer 23 such that the regions of the mesas M1 are separated from the region of the mesa M2. With the isolation trench 23$h$2, the light emitting diode part including the mesas M1 and the reverse-parallel diode part including the mesa M2 are defined. In some implementations, the reverse-parallel diode part may be located on an edge of the substrate. For example, FIG. 3 illustrates the reverse-parallel diode part including the mesa M2 is defined in the middle of the edge of the substrate.

In some implementations, the light emitting diode part is formed to surround at least a portion of the reverse-parallel diode part. For example, in FIG. 3, the reverse-parallel diode part has a polygonal shape having four sides and the light emitting diode part surrounds three sides of the reverse-parallel diode part. In some implementations, the reverse-parallel diode part can have a polygonal shape having more than four sides and the light emitting diode part can be formed to surround at least some of the sides of the polygonal shape. In this embodiment, the isolation process is illustrated as being performed after the mesas M1 and M2 and the reflective electrodes 30 are formed. However, it should be understood that the disclosed technology is not limited thereto. For example, the isolation process may also be performed before the formation of the reflective electrodes 30 or before the formation of the mesas M1 and M2.

Figure 4A:
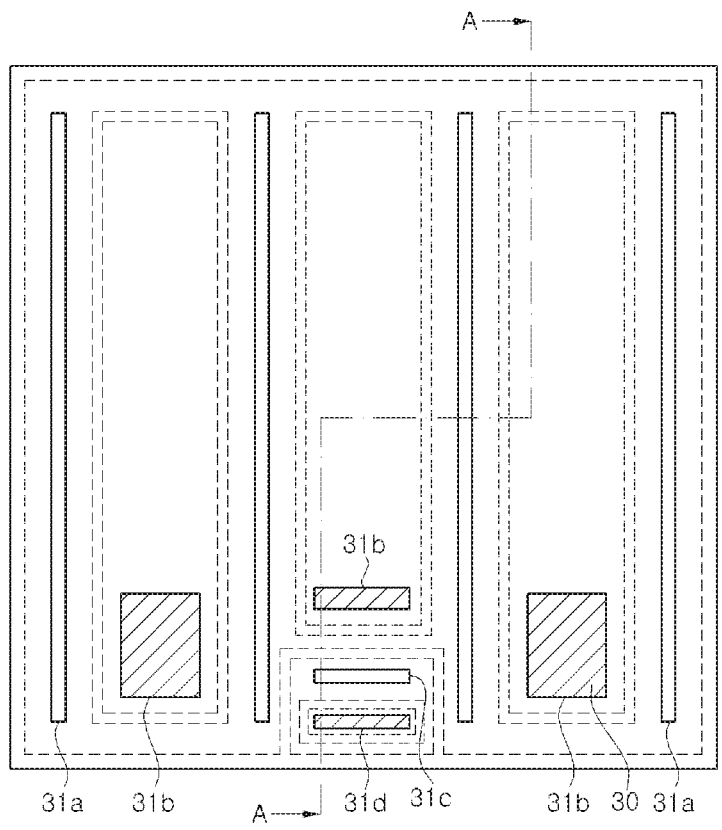
Figure 4B:
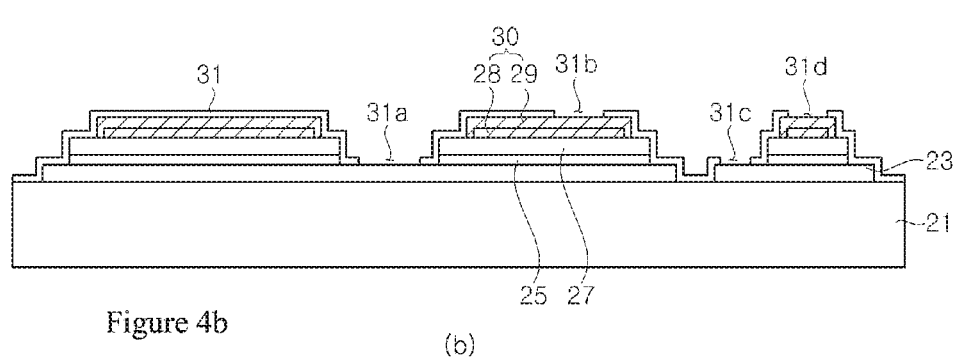

Referring to FIG. 4, a lower insulation layer 31 covering the plurality of mesas M1 and M2 and the first conductive type semiconductor layer 23 is formed. The lower insulation layer 31 has openings 31$a$ and 31$b$ formed at predetermined locations thereof to allow electrical connection to the first conductive type semiconductor layer 23 and the second conductive type semiconductor layer 27. For example, the lower insulation layer 31 may have openings 31$a$ which expose the first conductive type semiconductor layer 23, and openings 31$b$ which expose the reflective electrodes 30, in the light emitting diode part. In addition, the lower insulation layer 31 has an opening 31$c$ which exposes the first conductive type semiconductor layer 23 near the mesa M2, and an opening 31$d$ which exposes an upper area of the mesa M2, in the reverse-parallel diode part.

The openings 31$a$ may be placed between the mesas M1 and near an edge of the substrate 21, and may have an elongated shape extending along the mesas M1. In addition, the openings 31$b$ are placed only on the mesas M1 to be biased towards the same ends of the mesas M1. Although this embodiment is illustrated as having a relatively wide single opening 31b formed on each of the mesas M1, the disclosed technology is not limited thereto. For example, instead of the opening 31b, a plurality of relatively small openings may be formed on each of the mesas M1.

The lower insulation layer 31 may be formed of or include an oxide layer such as $SiO_2$ and the like, a nitride layer such as SiNx and the like, or an insulation layer of $MgF_2$ by chemical vapor deposition (CVD) and the like. The lower insulation layer 31 may be a single layer or multiple layers. In addition, the lower insulation layer 31 may be or include a distributed Bragg reflector (DBR) in which low refractive index material layers and high refractive index material layers are alternately stacked one above another. For example, an insulating reflective layer having high reflectance may be formed by stacking dielectric layers such as $SiO_2/TiO_2$, or $SiO_2/Nb_2O_5$, and the like.

Figure 5A:
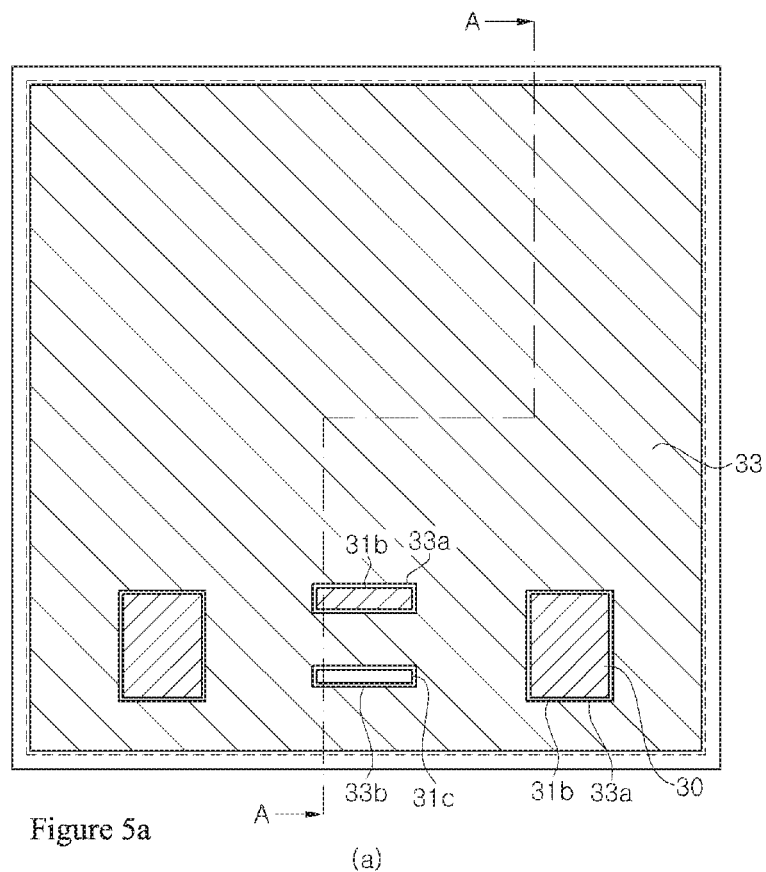
Figure 5B:
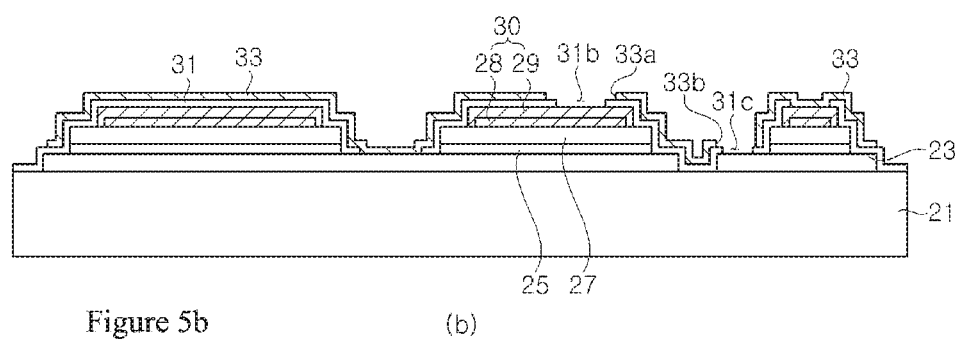

Referring to FIG. 5, a current dispersion layer 33 is formed on the lower insulation layer 31. The current dispersion layer 33 covers the plurality of mesas M1 and M2 and the first conductive type semiconductor layer 23. The current dispersion layer 33 has openings 33a, which are placed within upper areas of the mesas M1 and expose the reflective electrodes 30, respectively, and an opening 33b which exposes the first conductive type semiconductor layer 23 of the light emitting diode part.

The current dispersion layer 33 may form ohmic contact with the first conductive type semiconductor layer 23 through the openings 31a of the lower insulation layer 31. In addition, the current dispersion layer 33 is electrically connected to the mesa M2 through the opening 31d of the lower insulation layer 31. Accordingly, the current dispersion layer 33 electrically connects the first conductive type semiconductor layer 23 of the light emitting diode part to the second conductive type semiconductor layer 27 of the reverse-parallel diode part.

The current dispersion layer 33 is insulated from the plural mesas M and the reflective electrodes 30 by the lower insulation layer 31. In addition, each of the openings 33a of the current dispersion layer 33 has a greater area than the openings 31b of the lower insulation layer 31 to prevent the current dispersion layer 33 from contacting the reflective electrodes 30. Thus, sidewalls of the openings 33a are placed on the lower insulation layer 31. Further, the opening 33b of the current dispersion layer 33 has a greater area than the opening 31c of the lower insulation layer 31 to prevent the current dispersion layer 33 from contacting the first conductive type semiconductor layer 23 of the light emitting diode part. Thus, a sidewall of the opening 33b is also placed on the lower insulation layer 31.

The current dispersion layer 33 is formed on a substantially overall upper area of the substrate 21 excluding the openings 33a and 33b. Accordingly, current can be easily dispersed through the current dispersion layer 33. The current dispersion layer 33 may include a highly reflective metal layer, such as an Al layer, and the highly reflective metal layer may be formed on a bonding layer, such as Ti, Cr, Ni or the like. Further, a protective layer having a monolayer or composite layer structure of Ni, Cr or Au may be formed on the highly reflective metal layer.

Figure 6A:
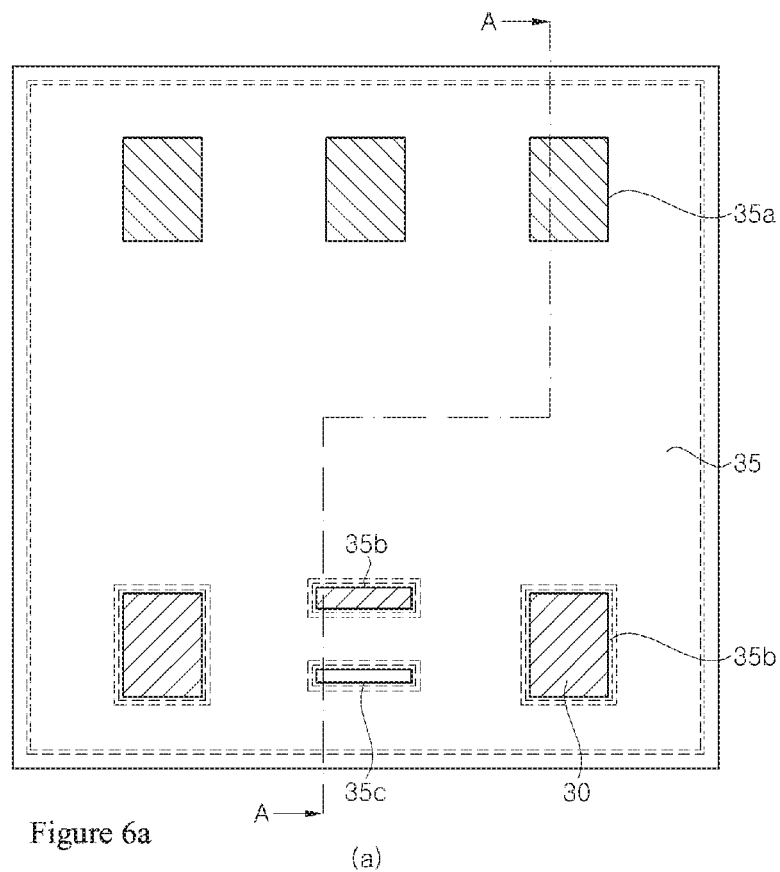
Figure 6B:
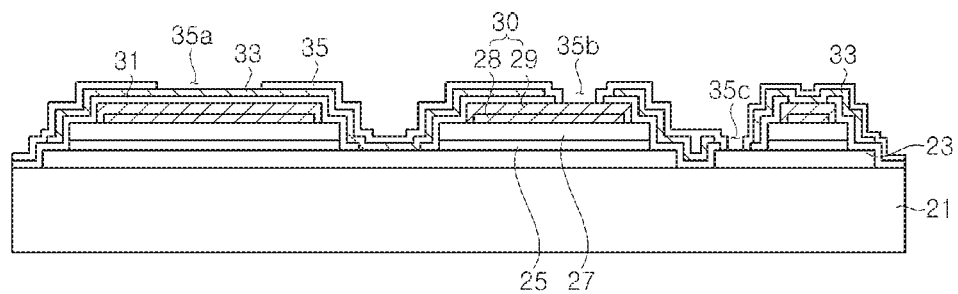

Referring to FIG. 6, an upper insulation layer 35 is formed on the current dispersion layer 33. The upper insulation layer 35 has openings 35a which expose the current dispersion layer 33 in the light emitting diode part, openings 35b which expose the reflective electrodes 30 in the light emitting diode part, and an opening 35c which exposes the first conductive type semiconductor layer 23 in the reverse-parallel diode part.

A plurality of openings 35a may be placed on each of the mesas M1, but is not limited thereto. Alternatively, a single opening 35a may be formed over the plurality of mesas M1. In addition, instead of the opening 35a of FIG. 6, a plurality of openings may be formed on each of the mesas M1.

The openings 35b expose the reflective electrodes 30, which are exposed through the openings 33a of the current dispersion layer 33 and the openings 31b of the lower insulation layer 31. The openings 35b have a narrower area than the openings 33a of the current dispersion layer 33. Accordingly, the sidewalls of the openings 33a of the current dispersion layer 33 are covered by the upper insulation layer 35. The openings 35b may have a narrower or greater area than the openings 31b of the lower insulation layer 31.

The opening 35c exposes the first conductive type semiconductor layer 23, which is exposed through the opening 33b of the current dispersion layer 33 and the opening 31c of the lower insulation layer 31. The opening 35c has a narrower area than the opening 33b of the current dispersion layer 33, whereby the opening 33b is covered by the upper insulation layer 35. The opening 35c may have a narrower or greater area than the opening 31c of the lower insulation layer 31.

The upper insulation layer 35 may be formed of or include an oxide insulation layer, a nitride insulation layer, or a polymer such as polyimide, Teflon, or Parylene, and the like.

Figure 7A:
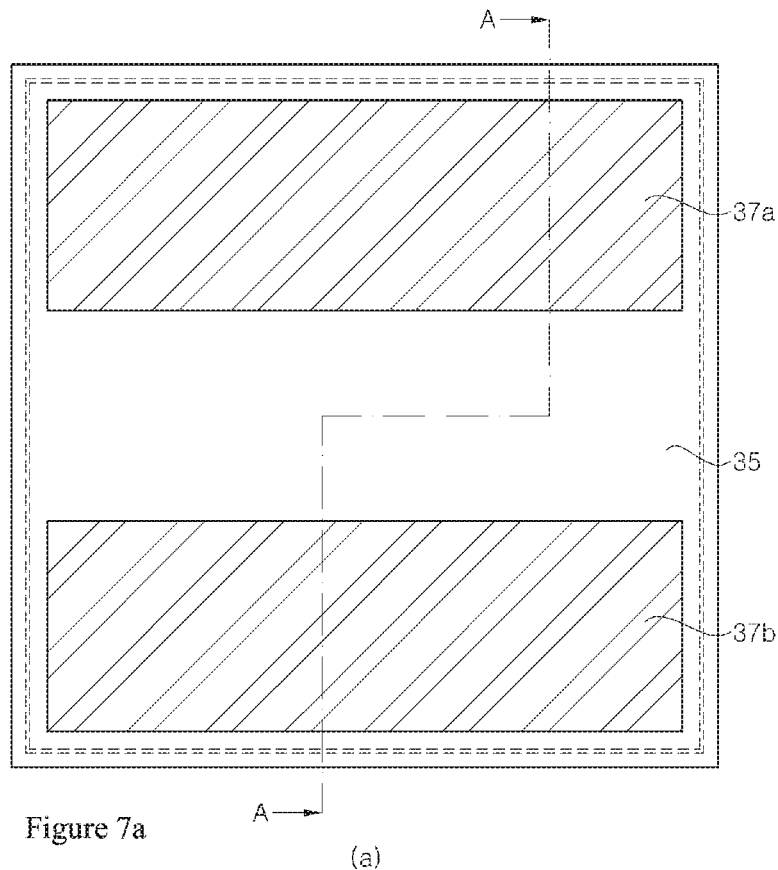
Figure 7B:
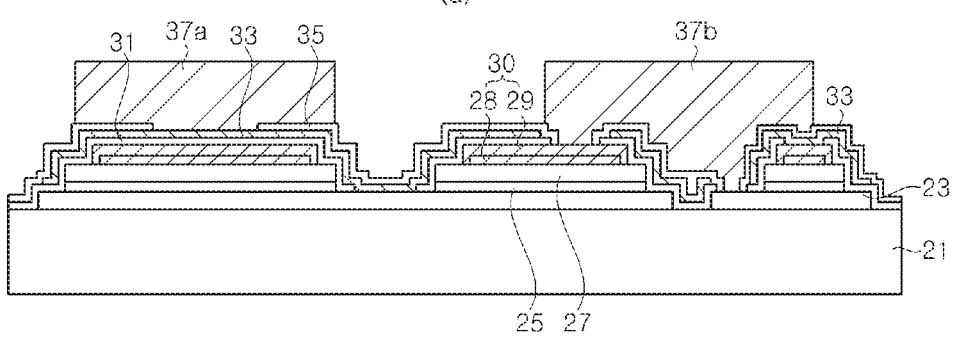

Referring to FIG. 7, a first electrode pad 37a and a second electrode pad 37b are formed on the upper insulation layer 35. The first electrode pad 37a is aligned or formed on the light emitting diode part and is connected to the current dispersion layer 33 through the opening 35a of the upper insulation layer 35. The second electrode pad 37b is aligned or formed over the light emitting diode part and the reverse-parallel diode part, and is connected to the reflective electrodes 30 through the openings 35b of the upper insulation layer 35 and to the first conductive type semiconductor layer 23 of the reverse-parallel diode part through the opening 35c. With this structure, the second conductive type semiconductor layer 27 of the light emitting diode part is electrically connected to the first conductive type semiconductor layer 23 of the reverse-parallel diode part through the second electrode pad 37b.

The first electrode pad 37a and the second electrode pad 37b may be used as pads for SMT or connection of bumps for mounting the light emitting diode chips on a sub-mount, a package, or a printed circuit board, and the like.

The first and second electrode pads 37a and 37b may be formed simultaneously by the same process, for example, a photolithography and etching process or a lift-off process. The first and second electrode pads 37a and 37b may include a bonding layer formed of or including, for example, Ti, Cr, Ni, and the like, and a highly conductive metal layer formed of or including Al, Cu, Ag, Au, and the like.

Then, the growth substrate 21 is divided into individual light emitting diode chip units, thereby providing final light emitting diode chips. As used herein, the light emitting diode chip refers to a flip-chip type light emitting diode chip mounted on a sub-mount, a package, or a printed circuit board via bumps or SMT using the first electrode pad 37a and the second electrode pad 37b. Herein, the second electrode pad 37b is placed over the light emitting diode part and the reverse-parallel diode part, and has a large size than an electrode pad of a general lateral type light emitting diode chip. Thus, the size of the reverse-parallel diode part can be relatively freely adjusted within the size of the second electrode pad 37b.

Although the substrate 21 is illustrated as remaining on the flip-chip type light emitting diode chip in this embodiment, the substrate 21 may be removed from the light emitting diode chips before or after the division into individual light emitting diode chip units.

Figure 8:
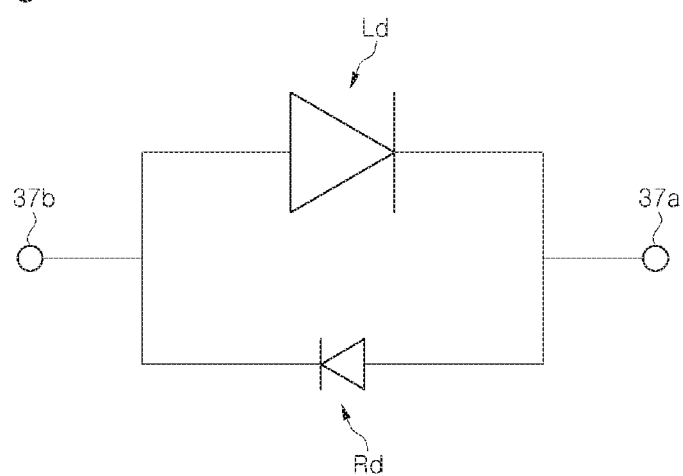
FIG. 8 is a schematic circuit diagram of the light emitting diode chip according to an exemplary embodiment of the disclosed technology.

Next, a light emitting diode chip according to one embodiment of the disclosed technology will be described in detail with reference to FIG. 7 and FIG. 8. FIG. 8 is a schematic circuit diagram of the light emitting diode chip according to the embodiment of the disclosed technology.

Referring to FIG. 7 and FIG. 8, the light emitting diode chip includes a light emitting diode part Ld and a reverse-parallel diode part Rd. The light emitting diode chip may include a substrate 21, reflective electrodes 30, a lower insulation layer 31, a current dispersion layer 33, an upper insulation layer 35, a first electrode pad 37a, and a second electrode pad 37b.

In this embodiment, the light emitting diode chip is a flip-chip type light emitting diode chip. However, it should be understood that the disclosed technology is not limited to the flip-chip type light emitting diode chip. For example, the disclosed technology may also be applied to a vertical type light emitting diode chip from which a growth substrate is removed.

The substrate 21 may be or include a growth substrate, for example, a sapphire substrate, a silicon carbide substrate, a silicon substrate, a gallium nitride substrate, and the like, for growth of gallium nitride-based epitaxial layers.

Herein, the "reverse-parallel diode part" Rd includes a diode disposed in the light emitting diode chip and connected in reverse parallel to the light emitting diode part Ld. In this embodiment, the reverse-parallel diode part Rd is composed of or includes a single diode connected in reverse parallel to the light emitting diode part Ld. Further, the light emitting diode part Ld may be separated from the reverse-parallel diode part Rd by an isolation trench 23h2 (see FIG. 3). The light emitting diode part Ld has a greater area than the reverse-parallel diode part Rd.

Further, each of the light emitting diode part Ld and the reverse-parallel diode part Rd includes a first conductive type semiconductor layer 23, an active layer 25, and a second conductive type semiconductor layer 27. The first conductive type semiconductor layer 23 may include, for example, n-type GaN, and the second conductive type semiconductor layer 27 may include, for example, p-type GaN, or vice versa. The active layer 25 is placed between the first conductive type semiconductor layer 23 and the second conductive type semiconductor layer 27, and may have a single quantum well structure or a multi-quantum well structure.

The light emitting diode part Ld and the reverse-parallel diode part Rd are formed by patterning nitride semiconductor layers grown by the same growth process, for example, MOCVD, or MBE, and the like, and then separated from each other. Thus, the light emitting diode part Ld and the reverse-parallel diode part Rd may have the first conductive type semiconductor layers 23, the active layers 27b and the second conductive type semiconductor layers 27, which have the same composition and the same structure.

The light emitting diode part Ld may include a single mesa or a plurality of mesas M1 (see FIG. 1) placed on the first conductive type semiconductor layer 23. The mesa M1 includes the active layer 25 and the second conductive type semiconductor layer 27. The plurality of mesas M1 may have an elongated shape and be parallel to each other. The reverse-parallel diode part Rd includes a mesa M2 (see FIG. 1) placed on the first conductive type semiconductor layer 23.

The reflective electrodes 30 are aligned or formed on the mesas M1, that is, on the second conductive type semiconductor layer 27. Each of the reflective electrodes 30 may include a metal reflective layer 28 and a barrier layer 29, and may form ohmic contact with the second conductive type semiconductor layer 27. Furthermore, the reflective electrode 30 may be formed on the mesa M2. The reflective electrode 30 placed on the mesa M2 may also form ohmic contact with the second conductive type semiconductor layer 27 of the reverse-parallel diode part Rd. Alternatively, a different type of ohmic contact layer than the reflective electrode 30 may be formed on the mesa M2.

The first electrode pad 37a and the second electrode pad 37b are placed on the reflective electrodes 30. In addition, the first electrode pad 37a is aligned or formed on the light emitting diode part Ld and the second electrode pad 37b is aligned or formed over the light emitting diode part Ld and the reverse-parallel diode part Rd. Further, the first electrode pad 37a is electrically connected to the first conductive type semiconductor layer 23 of the light emitting diode part Ld and to the second conductive type semiconductor layer 27 of the reverse-parallel diode part Rd. The second electrode pad 37b is electrically connected to the second conductive type semiconductor layer 27 of the light emitting diode part Ld and to the first conductive type semiconductor layer 23 of the reverse-parallel diode part Rd.

For example, as described above with reference to FIG. 5, the current dispersion layer 33 may be placed between the first electrode pad 37a and the reflective electrode 30, and may be electrically connected to the first conductive type semiconductor layer 23 of the light emitting diode part Ld and to the second conductive type semiconductor layer 27 of the reverse-parallel diode part Rd. Furthermore, the current dispersion layer 33 covers most of the light emitting diode part Ld and the reverse-parallel diode part Rd, and has openings 33a (see FIG. 5), which expose the reflective electrodes 30 on the light emitting diode part Ld, and an opening 33b, which expose the first conductive type semiconductor layer 23 of the light emitting diode part Rd.

The second electrode pad 37b may electrically connect the reflective electrodes 30 exposed through the openings 33a to the first conductive type semiconductor layer exposed through the opening 33b.

The lower insulation layer 31 is placed between the reflective electrodes 30 and the current dispersion layer 33 and insulates the current dispersion layer 33 from the reflective electrodes 30. As described with reference to FIG. 4, the lower insulation layer 31 has openings 31a which expose the first conductive type semiconductor layer 23 in the light emitting diode part Ld, openings 31b which expose the reflective electrodes 30 in the light emitting diode part Ld, an opening 31c which exposes the first conductive type semiconductor layer 23 in the reverse-parallel diode part Rd, and an opening 31d which exposes the reflective electrode 30 in the reverse-parallel diode part Rd. The current dispersion layer 33 may connect the first conductive type semiconductor layer 23 exposed through the openings 31a to the reflective electrode 30 exposed through the opening 31d.

The upper insulation layer 35 is placed between the current dispersion layer 33 and the first and second electrode pads 37a and 37b, and insulates the second electrode pad 37b from the current dispersion layer 33. As described with reference to FIG. 6, in the light emitting diode part Ld, the upper insulation layer 35 has openings 35a which expose the current dispersion layer 33 under the first electrode pad 37a, and openings 35b which expose the reflective electrodes 30 under the second electrode pad 37b. In addition, in the reverse-parallel diode part, the upper insulation layer 35 has an opening 35c which exposes the first conductive type semiconductor layer 23, as described with reference to FIG. 6.

The second electrode pad 37b covers the openings 35b and 35c on the upper insulation layer 35, whereby the reflective electrodes 30 on the light emitting diode part Ld can be electrically connected to the first conductive type semiconductor layer 23 of the reverse-parallel diode part Rd.

According to some implementations of the disclosed technology, as shown in FIG. 8, a reverse parallel circuit is implemented between the first electrode pad 37a and the second electrode pad 37b, wherein the light emitting diode part Ld is connected in reverse parallel to the reverse-parallel diode part Ld. As a result, the light emitting diode part Ld can be protected from electrostatic discharge by the reverse-parallel diode part Rd.

According to the disclosed technology, the current dispersion layer 33 covers substantially the entire area of the first conductive type semiconductor layer 23 between the mesas M1 and the mesas M1. With this structure, current can be easily dispersed in the light emitting diode part Ld through the current dispersion layer 33. Furthermore, the current dispersion layer 33 may include a reflective metal layer such as an Al layer or the lower insulation layer may be formed of or include an insulation reflective layer such that light not reflected by the reflective electrodes 30 can be reflected by the current dispersion layer 33 or the lower insulation layer 31, thereby improving light extraction efficiency.

Experimental Example

Variation in yield of light emitting diode chips upon application of ESD was ascertained using typical flip-chip type light emitting diode chips (100 chips, Comparative Example) not including a reverse-parallel diode and flip-chip type light emitting diode chips (100 chips, Inventive Example) including a reverse-parallel diode part Rd according to the embodiments as described above. The samples of Comparative Example and Inventive Example were fabricated by the same process excluding designs on photomasks.

Variation in yield of light emitting diode chips was ascertained by applying a reverse voltage of 3 kV to the samples of Comparative Example and Inventive Example. The samples of Comparative Example resulted in a yield reduction of 31% from a yield of 63.4% before application of ESD to a yield of 32.4% after application of ESD. On the contrary, the samples of Example resulted in a yield reduction of 2.3% from a yield of 70.3% before application of ESD to a yield of 68.1% after application of ESD.

Accordingly, it can be seen that light emitting diode chips highly resistant to ESD can be fabricated when including the reverse-parallel diode part Rd.

FIG. 9 to FIG. 15 are views illustrating a method of fabricating a light emitting diode chip according to another embodiment of the disclosed technology. Here, (a) is a plan view and (b) is a cross-sectional view taken along line A-A.

The light emitting diode chip and the method of fabricating the same according to this embodiment are generally similar to the light emitting diode chip and the method of fabricating the same described with reference to FIG. 1 to FIG. 7 except that the light emitting diode chip according to this embodiment includes a reverse-parallel diode part Bi-Rd in which two diodes are connected in opposite directions. The following description will focus upon the different features of this embodiment from those of the above embodiment.

Figure 9A:
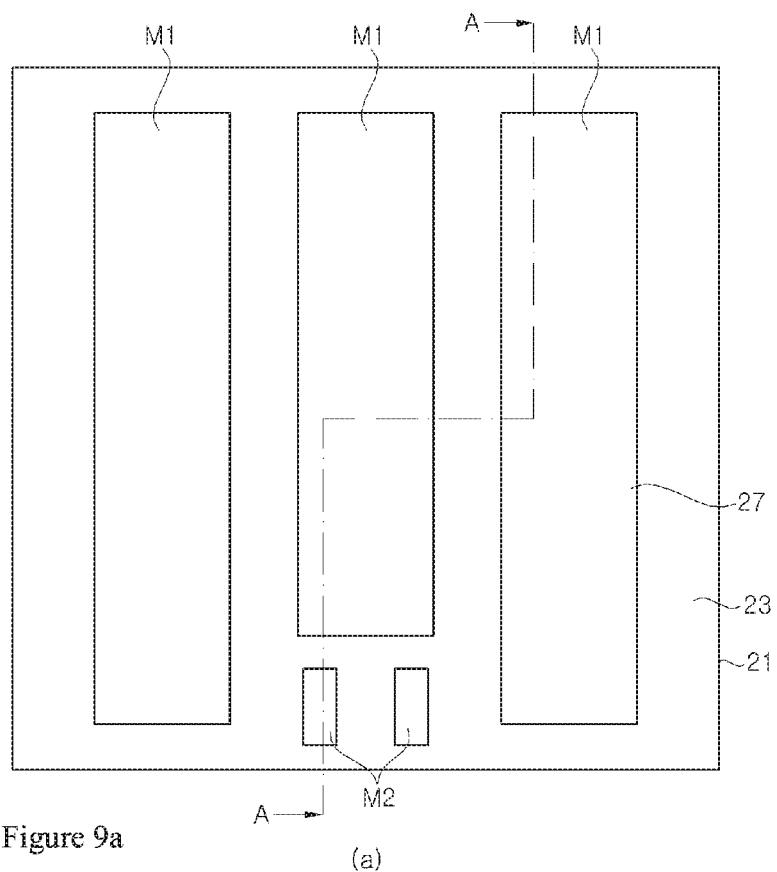
FIG. 9 to FIG. 15 are schematic plan views and sectional views illustrating a light emitting diode chip and a method of fabricating the same according to an exemplary embodiment of the disclosed technology.
Figure 9B:
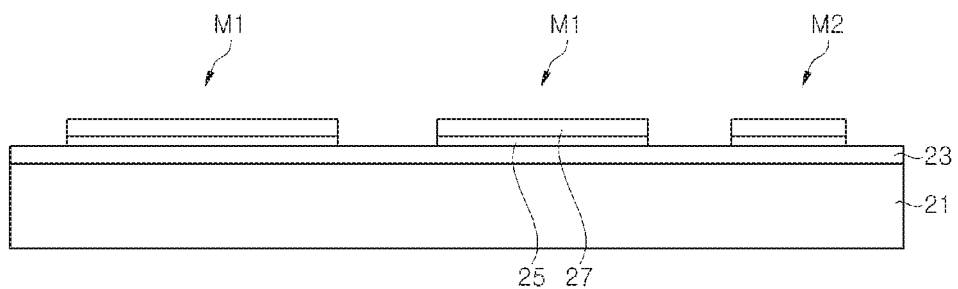

Referring to FIG. 9, as described with reference to FIG. 1, a first conductive type semiconductor layer 23 is formed on a substrate 21, and a plurality of mesas M1 and M2 are formed on the first conductive type semiconductor layer 23 to be separated from one another. While in the embodiment shown in FIG. 1, a single mesa M2 is formed, in FIG. 9, two mesas M2 are formed to face each other. The first conductive type semiconductor layer 23 is exposed between the mesas M2.

As described with reference to FIG. 1, the plurality of mesas M1 and M2 may be formed by growing epitaxial layers including the first conductive type semiconductor layer 23, an active layer 25 and a second conductive type semiconductor layer 27 on the substrate 21 by metal organic chemical vapor deposition or the like, followed by patterning the second conductive type semiconductor layer 27 and the active layer 25 so as to expose the first conductive type semiconductor layer 23.

Figure 10A:
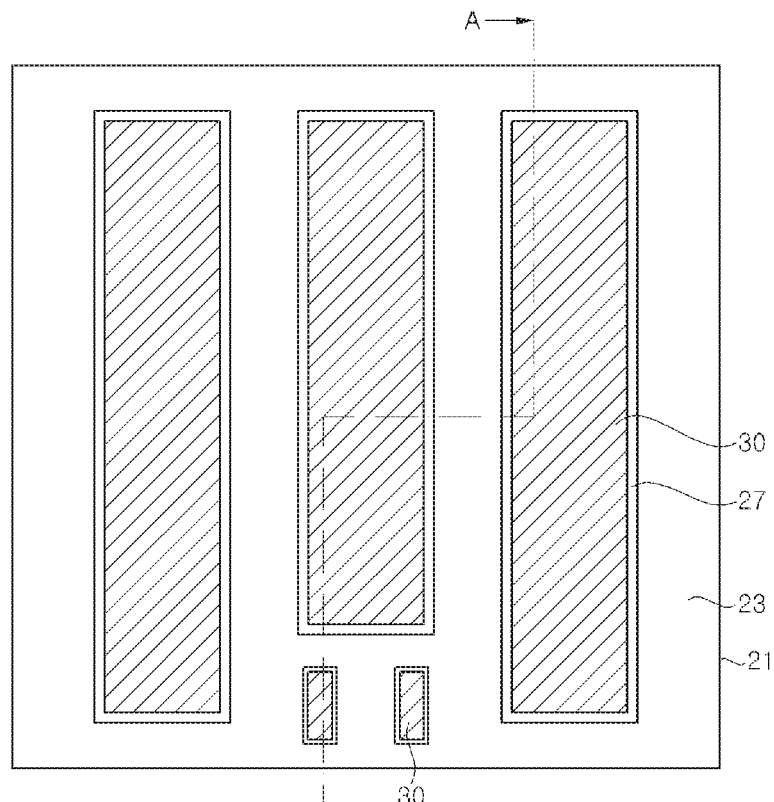
Figure 10B:
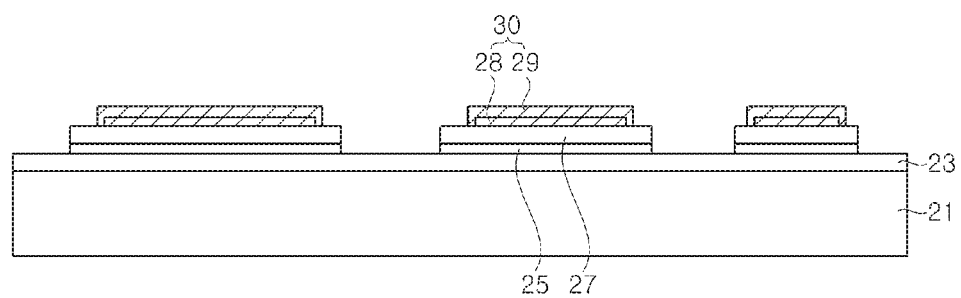

Referring to FIG. 10, as described with reference to FIG. 2, a reflective electrode 30 is formed on each of the mesas M1 and M2. The reflective electrodes of this embodiment are the same as those of the embodiment described with reference to FIG. 2 except that the reflective electrodes 30 are formed on the two mesas M2, and thus, a detailed description of the reflective electrodes will be omitted. In addition, although the reflective electrodes 30 are illustrated as being formed on the mesas M2, it should be understood that the reflective electrodes 30 on the mesas M2 can be omitted and an ohmic metal layer, rather than the reflective electrodes 30, may be formed on the mesas M2.

Figure 11A:
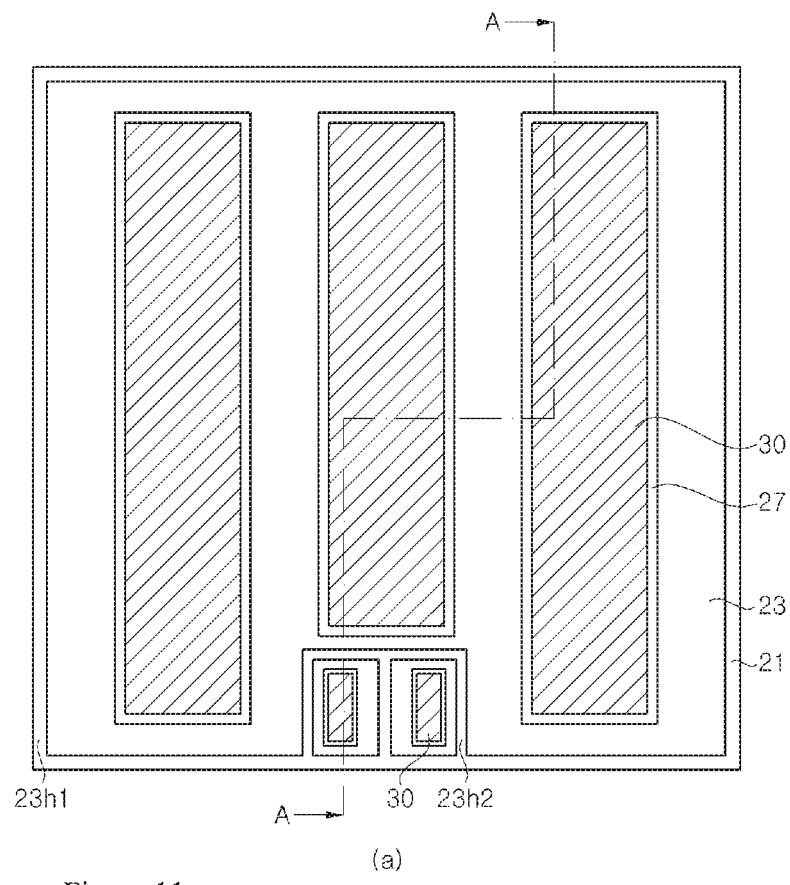
Figure 11B:
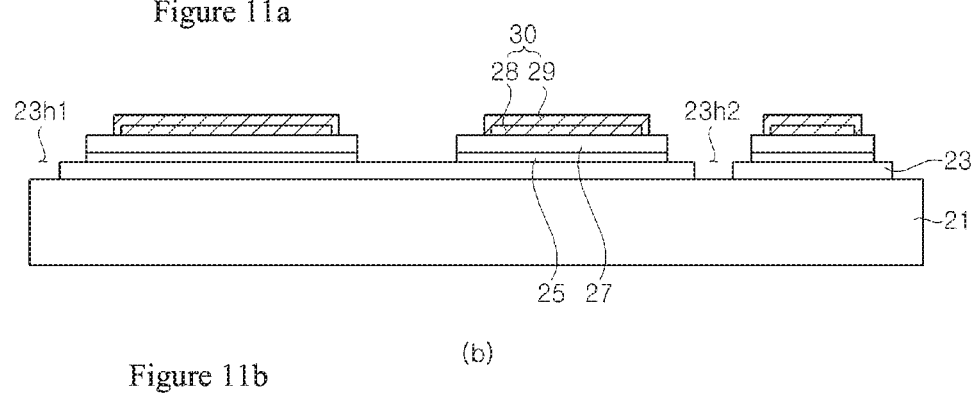

Referring to FIG. 11, as described with reference to FIG. 3, a process of isolating light emitting diode chip areas from one another is performed to form insolation trenches 23h1 which define the chip areas. At this time, isolation trenches 23h2 are also formed to isolate each of the mesas M2 from the mesas M1. In this embodiment, an area including the mesas M1 corresponds to a light emitting diode part Ld and an area including the mesas M2 corresponds to a reverse-parallel diode part Bi-Rd. In this embodiment, it should be noted that the isolation trench 23h2 is also formed between the mesas M2.

Although in FIG. 3, the isolation process is performed after the mesas M1 and M2 and the reflective electrodes 30 are formed, the disclosed technology is not limited thereto. That is, the isolation process may also be performed before the formation of the reflective electrodes 30 or before the formation of the mesas M1, M2.

Figure 12A:
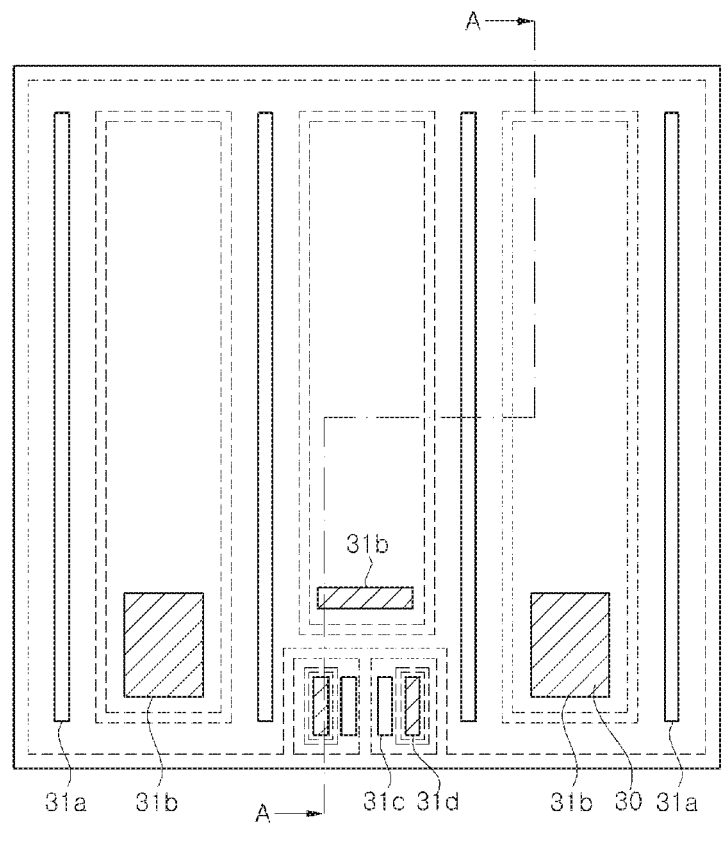
Figure 12B:
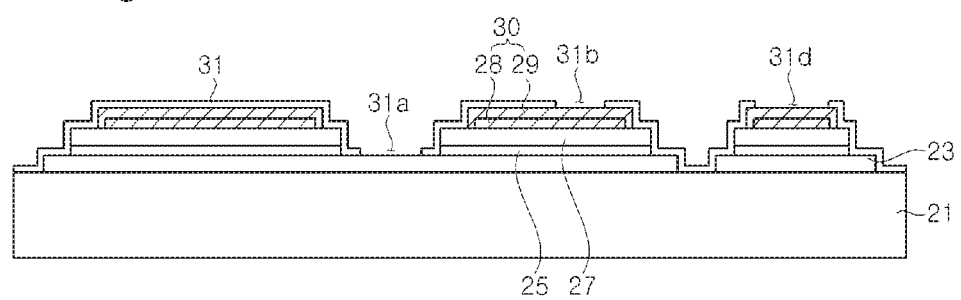

Referring to FIG. 12, as described with reference to FIG. 4, a lower insulation layer 31 covering the plurality of mesas M1, M2 and the first conductive type semiconductor layer 23 is formed. As described with reference to FIG. 4, the lower insulation layer 31 has openings 31a and 31b.

In addition, the lower insulation layer 31 has an opening 31c which exposes the first conductive type semiconductor layer 23 near each of the mesas M2, and an opening 31d which exposes an upper area of each of the mesas M2.

Figure 13A:
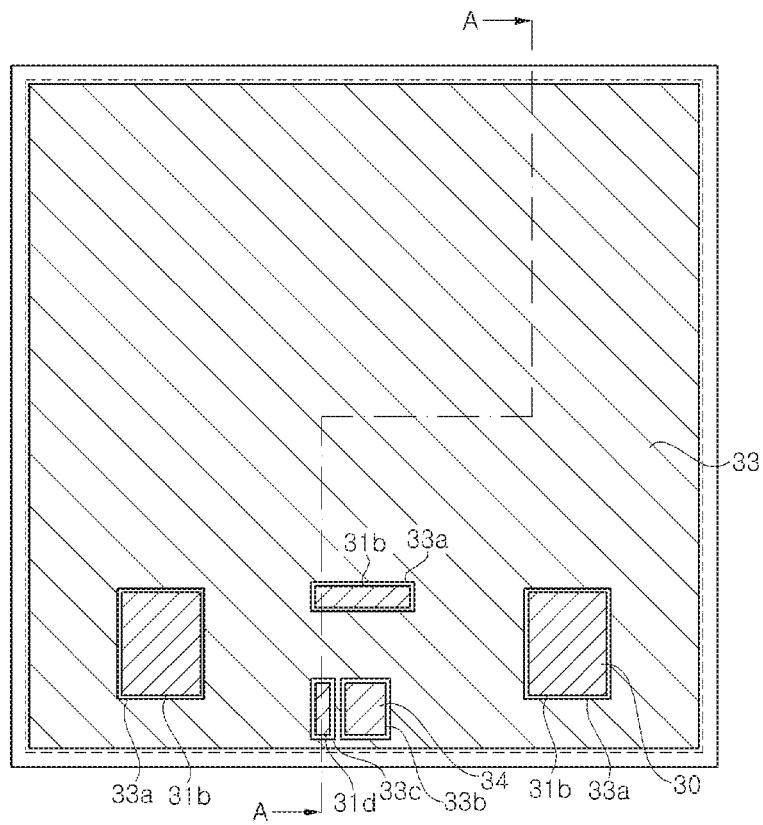
Figure 13B:
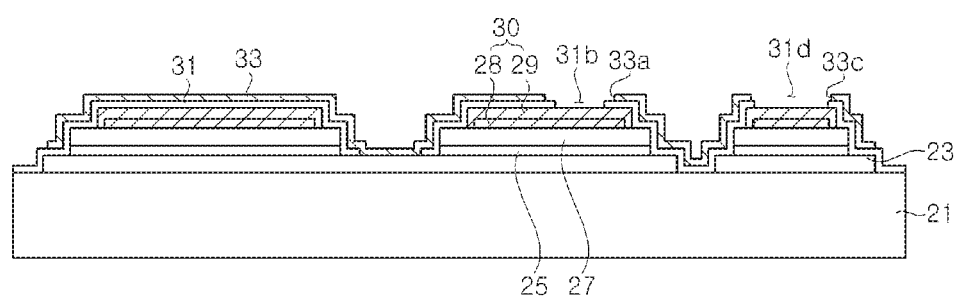

Referring to FIG. 13, as described with reference to FIG. 5, a current dispersion layer 33 is formed on the lower insulation layer 31. In addition, the current dispersion layer 33 covers the mesas M1 and the first conductive type semiconductor layer 23 in the light emitting diode part Ld, and has openings 33a which are placed within upper areas of the mesas M and expose the reflective electrodes 30, respectively. Further, in the reverse-parallel diode part Bi-Rd, the current dispersion layer 33 has an opening 33b which exposes the first conductive type semiconductor layer 23 of each diode, covers one of the two diodes, and has an opening 33c which exposes the mesa M2 of the other diode.

With this structure, the first conductive type semiconductor layer 23 of the light emitting diode part Ld is electrically connected to one mesa M2 of the reverse-parallel diode part Bi-Rd through the current dispersion layer 33.

In the reverse parallel diode part Bi-Rd, the first conductive type semiconductor layers 23 exposed through the openings 33b are connected to each other by a connection pattern 34 which is formed together with the current dispersion layer 33.

Figure 14A:
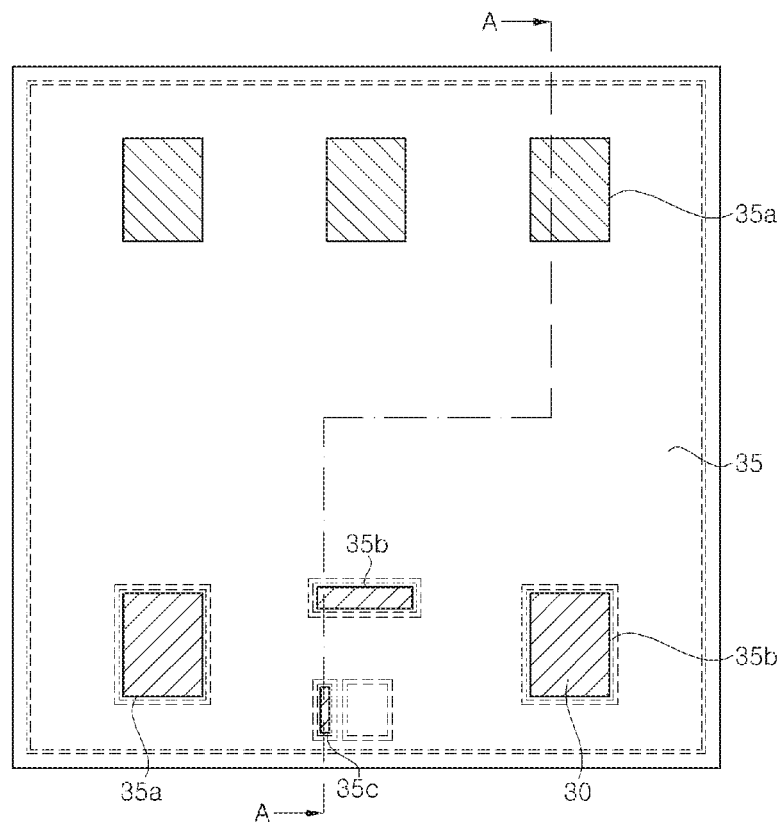
Figure 14B:
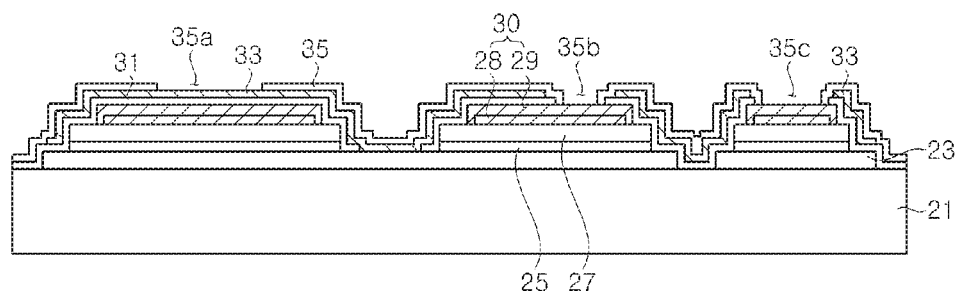

Referring to FIG. 14, as described with reference to FIG. 6, an upper insulation layer 35 is formed on the current dispersion layer 33. As described with reference to FIG. 6, in the light emitting diode part Ld, the upper insulation layer 35 has openings 35a which expose the current dispersion layer 33, and openings 35b which expose the reflective electrodes 30. Unlike the opening 35c of FIG. 6, the upper insulation layer 35 has an opening 35c which exposes the other mesa M2 in the reverse-parallel diode part. In this embodiment, the upper insulation layer 35 is not required to expose the first conductive type semiconductor layer 23 in the reverse-parallel diode part Bi-Rd.

In this embodiment, the opening 35c exposes the reflective electrode 30, which is exposed through the opening 33c of the current dispersion layer 33 and through the opening 31d of the lower insulation layer 31. The opening 35c has a narrower area than the opening 33c of the current dispersion layer 33, whereby a sidewall of the opening 33c is covered by the upper insulation layer 35. The opening 35c may have a narrower or greater area than the opening 31d of the lower insulation layer 31.

Figure 15A:
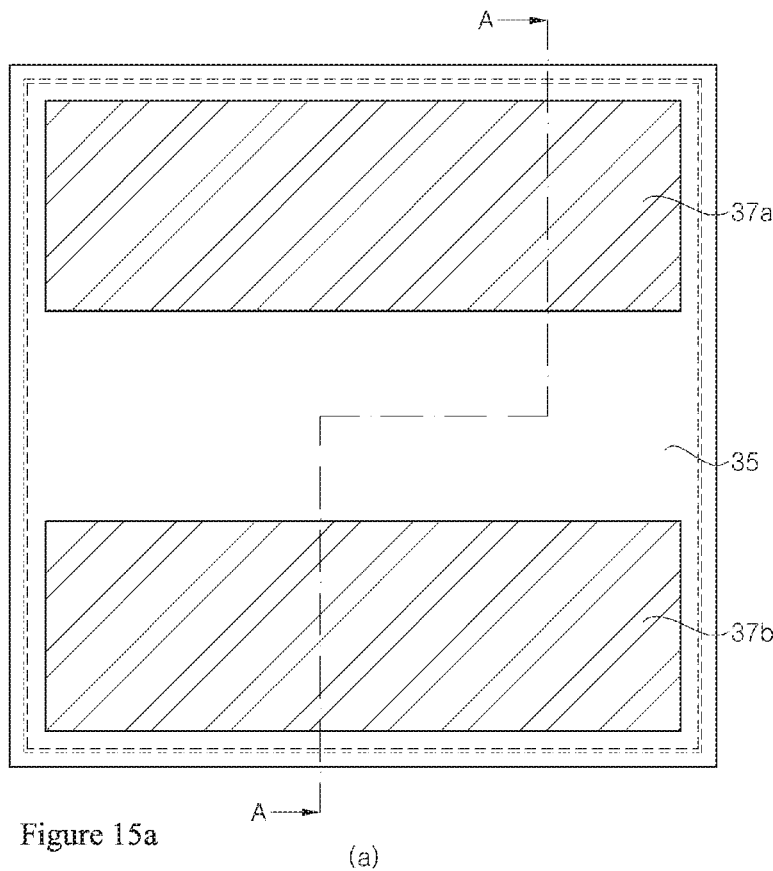
Figure 15B:
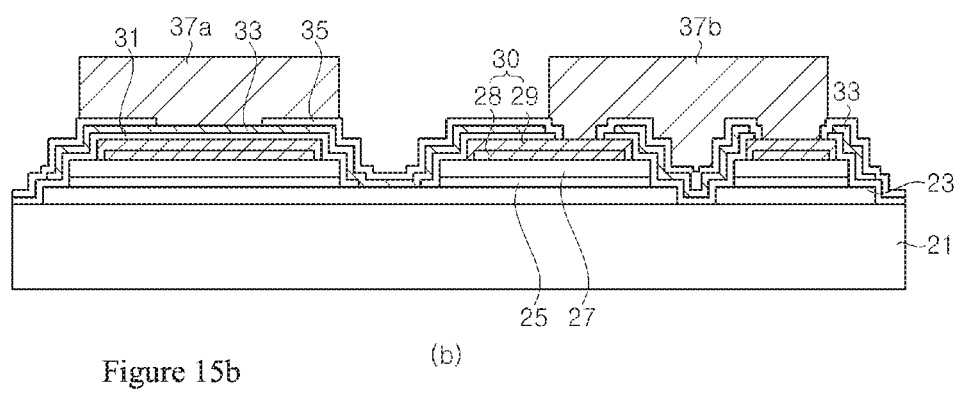

Referring to FIG. 15, as described with reference to FIG. 7, a first electrode pad 37a and a second electrode pad 37b are formed on the upper insulation layer 35. The first electrode pad 37a is aligned or formed on the light emitting diode part and is connected to the current dispersion layer 33 through the openings 35a of the upper insulation layer 35.

The second electrode pad 37b is aligned or formed over the light emitting diode part and the reverse-parallel diode part, is connected to the reflective electrodes 30 through the openings 35b of the upper insulation layer 35, and connected to the reflective electrode (M2) exposed through the opening 35c in the reverse-parallel diode part to be electrically connected to the mesa M2. With this structure, the second conductive type semiconductor layer 27 of the light emitting diode part is electrically connected to the second conductive type semiconductor layer 23 of the other diode of the reverse-parallel diode part through the second electrode pad 37b.

Then, the substrate 21 is divided into individual light emitting diode chip units, thereby providing final light emitting diode chips. Although the substrate 21 is illustrated as remaining on the flip-chip type light emitting diode chip in this embodiment, the substrate 21 may be removed from the light emitting diode chips before or after the division into individual light emitting diode chip units. Although the substrate 21 is illustrated as remaining on the flip-chip type light emitting diode chip in this embodiment, the substrate 21 may be removed from the light emitting diode chips before or after the division into individual light emitting diode chip units.

Figure 16:
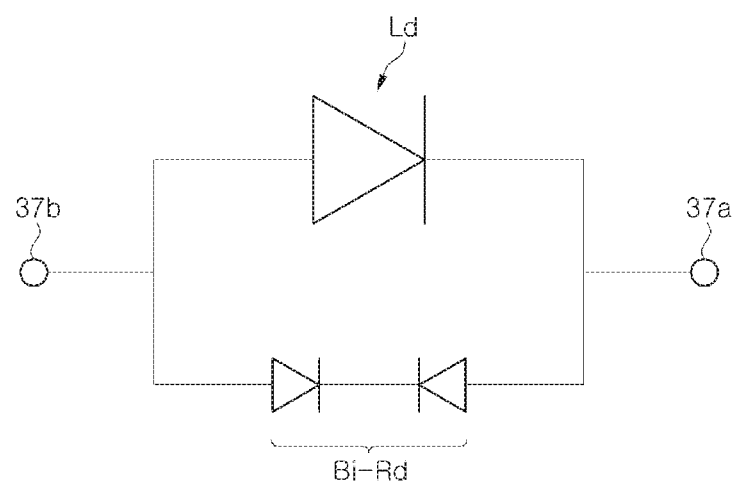
FIG. 16 is a schematic circuit diagram of the light emitting diode chip according to an exemplary embodiment of the disclosed technology.

FIG. 16 schematically shows a circuit diagram of the light emitting diode chip according to this embodiment. As shown in FIG. 16, the light emitting diode chip according to this embodiment includes the light emitting diode part Ld and the reverse-parallel diode part Bi-Rd between the first electrode pad 37a and the second electrode pad 37b, in which the reverse-parallel diode part Bi-Rd includes two diodes connected in opposite directions.

The first electrode pad 37a is electrically connected to the first conductive type semiconductor layer (cathode, 23) of the light emitting diode part Ld and the second conductive type semiconductor layer (anode, 27) of one of two diodes of the reverse-parallel diode part. In this embodiment, the first conductive type semiconductor layer 23 of the light emitting diode part Ld is electrically connected to the reflective electrode 30 on one diode of the reverse-parallel diode part through the current dispersion layer 33.

The second electrode pad 37b is electrically connected to the second conductive type semiconductor layer (anode, 27) of the light emitting diode part Ld and the second conductive type semiconductor layer (anode, 27) of the other diode of the two diodes of the reverse-parallel diode part. In this embodiment, the second electrode pad 37b electrically connects the reflective electrode 30 of the light emitting diode part Ld to the reflective electrode 30 on the other diode of the reverse-parallel diode part Bi-Rd.

As shown in FIG. 16, the two diodes may be disposed to face the first conductive type semiconductor layers 23, respectively.

According to this embodiment, the reverse-parallel diode part Bi-Rd having two diodes connected in opposite directions is connected to the light emitting diode part Ld, thereby providing a light emitting diode chip having strong resistance to ESD.

FIG. 17 to FIG. 23 are schematic plan views and sectional views illustrating a light emitting diode chip and a method of fabricating the same according to another embodiment of the disclosed technology. Here, (a) is a plan view and (b) is a cross-sectional view taken along line A-A. The light emitting diode chip and the method of fabricating the same according to this embodiment are generally similar to the light emitting diode chip and the method of fabricating the same described with reference to FIG. 9 to FIG. 15 except that the light emitting diode chip according to this embodiment includes a reverse-parallel diode part Bi-Rd in which two diodes share a cathode. The following description will focus upon the different features of this embodiment from those of the above embodiment.

Figure 17A:
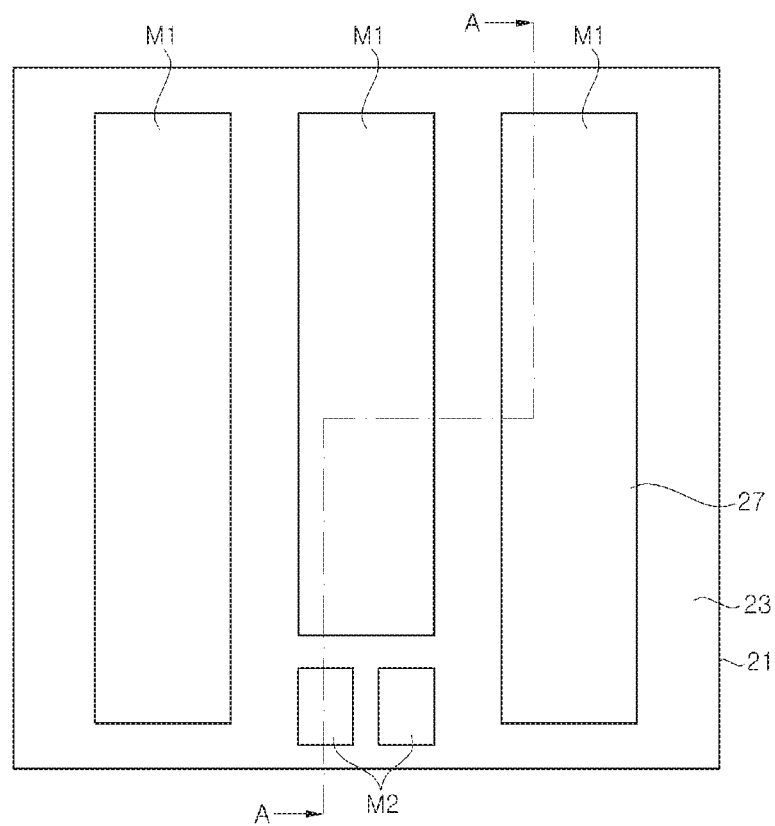
FIG. 17 to FIG. 23 are schematic plan views and sectional views illustrating a light emitting diode chip and a method of fabricating the same according to an exemplary embodiment of the disclosed technology.
Figure 17B:
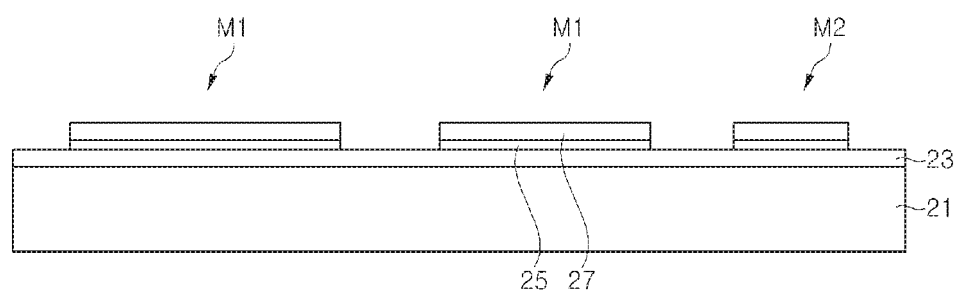

First, referring to FIG. 17, as described with reference to FIG. 9, a first conductive type semiconductor layer 23 is formed on a substrate 21, and a plurality of mesas M1 and M2 are formed on the first conductive type semiconductor layer 23 to be separated from one another. In the embodiment shown in FIG. 9, the two mesas M2 are separated a relatively long distance from each other, whereas the two mesas M2 may be disposed relatively close to each other and may have a relatively large size.

Figure 18A:
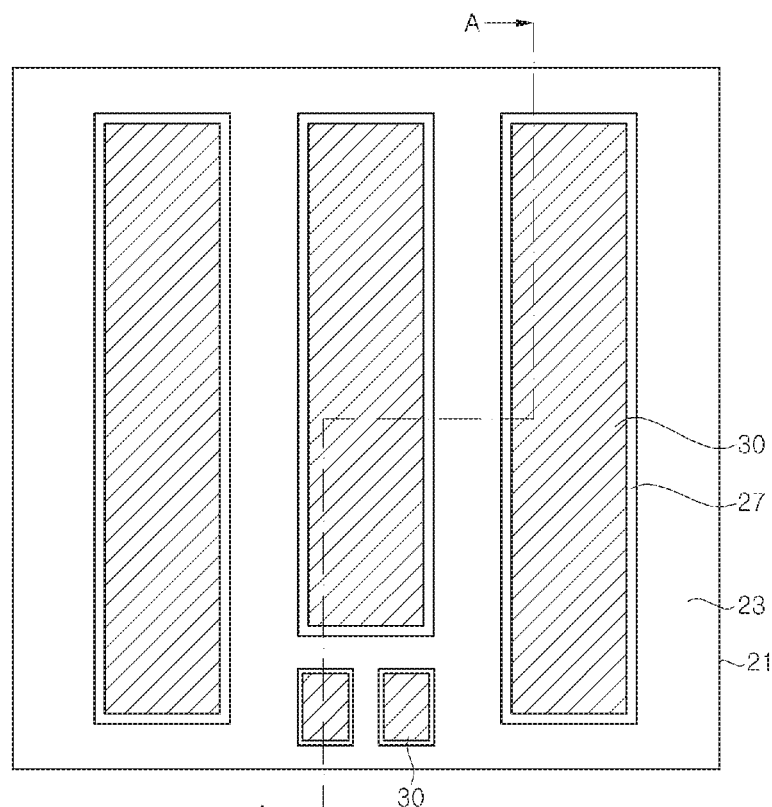
Figure 18B:
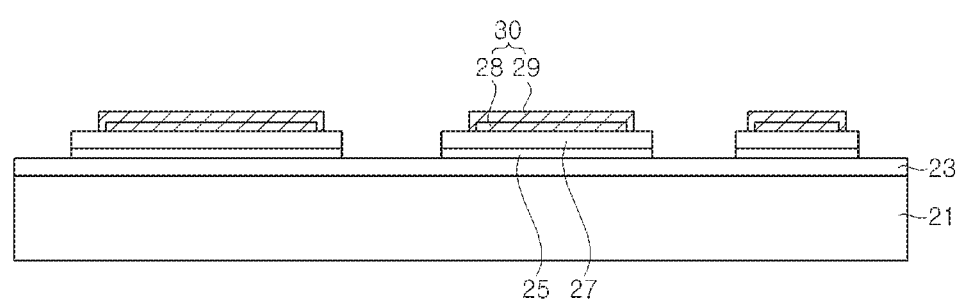

Referring to FIG. 18, as described with reference to FIG. 10, a reflective electrode 30 is formed on each of the mesas M1 and M2. Except the size and arrangement of the two mesas M2, this embodiment is the same as the embodiment described with reference to FIG. 2, and a detailed description thereof will be omitted.

Figure 19A:
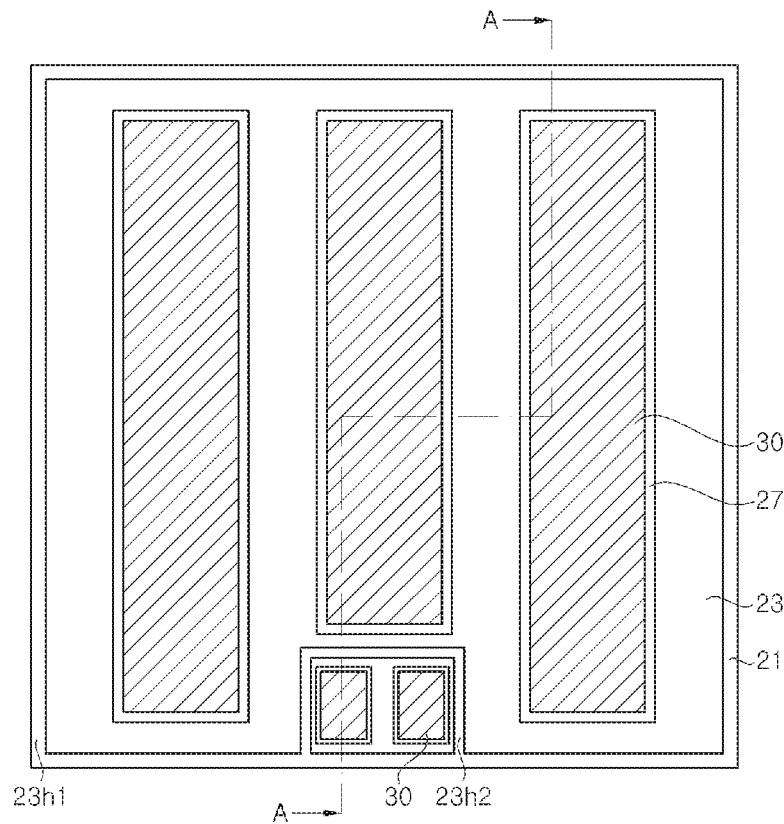
Figure 19B:
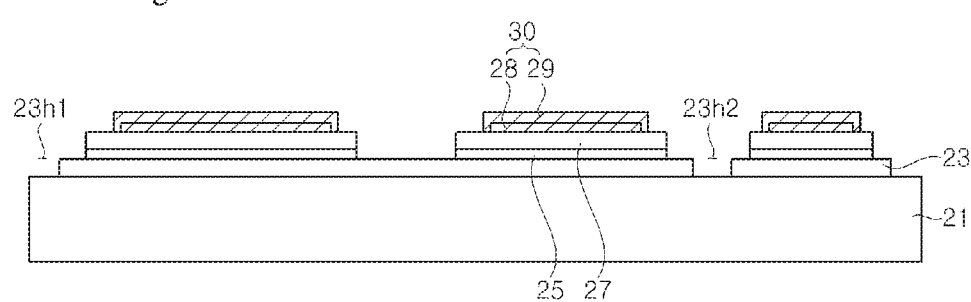

Referring to FIG. 19, as described with reference to FIG. 11, a process of isolating light emitting diode chip areas from each other is performed to form insolation trenches 23h1 which define the chip areas. At this time, isolation trenches 23h2 are also formed to isolate the mesas M2 from the mesas M1. In this embodiment, an area including the mesas M1 corresponds to the light emitting diode part Ld and an area including the mesas M2 corresponds to the reverse-parallel diode part Bi-Rd. As in the above embodiment, although the isolation trench 23h2 is also formed between the mesas M2, the mesas M2 are placed on the same first conductive type semiconductor layer 23 and the isolation trench 23h2 does not isolate the mesas M2 from each other in this embodiment.

Figure 20A:
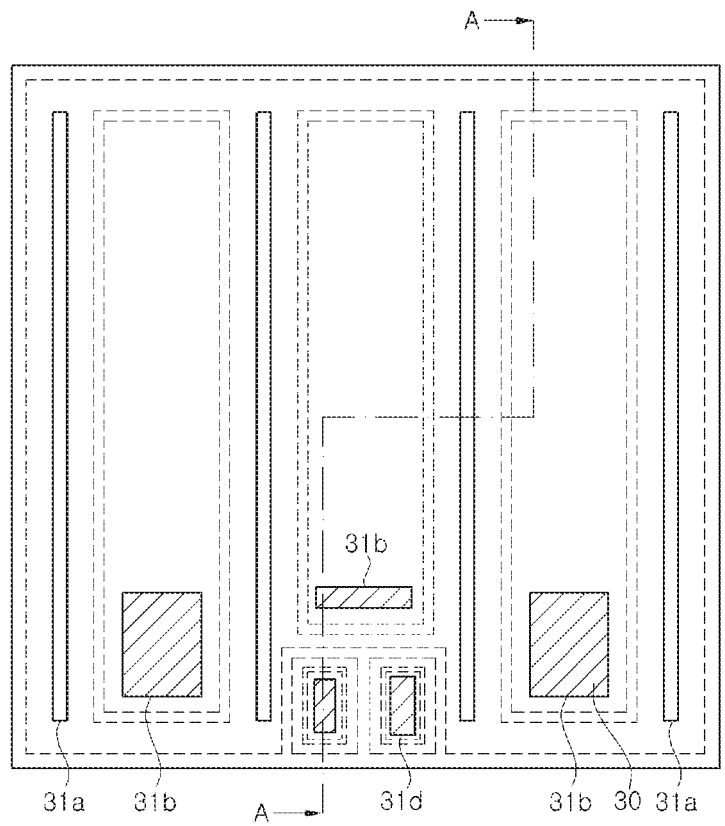
Figure 20B:
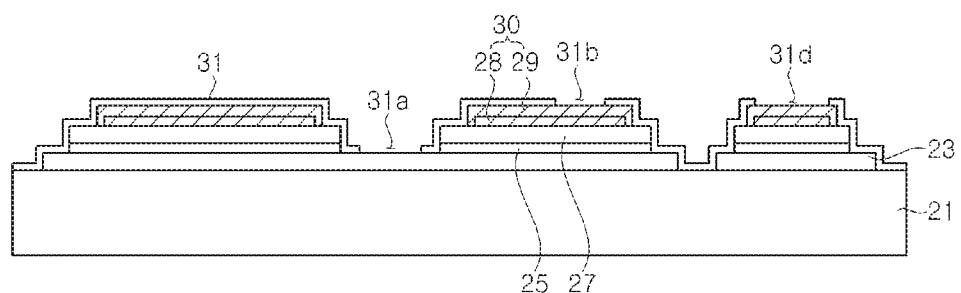

Referring to FIG. 20, as described with reference to FIG. 12, a lower insulation layer 31 covering the plurality of mesas M1 and M2 and the first conductive type semiconductor layer 23 is formed. As described with reference to FIG. 12, the lower insulation layer 31 has openings 31a and 31b.

In addition, the lower insulation layer 31 has openings 31d which expose upper areas of the mesas M2 in the reverse-parallel diode part Bi-Rd, respectively. The first conductive type semiconductor layer of the reverse-parallel diode part Bi-Rd is completely covered by the lower insulation layer 31. Namely, unlike the above embodiment, the lower insulation layer 31 does not have an opening 31c which exposes the first conductive type semiconductor layer 23 near each of the mesa M2.

Figure 21A:
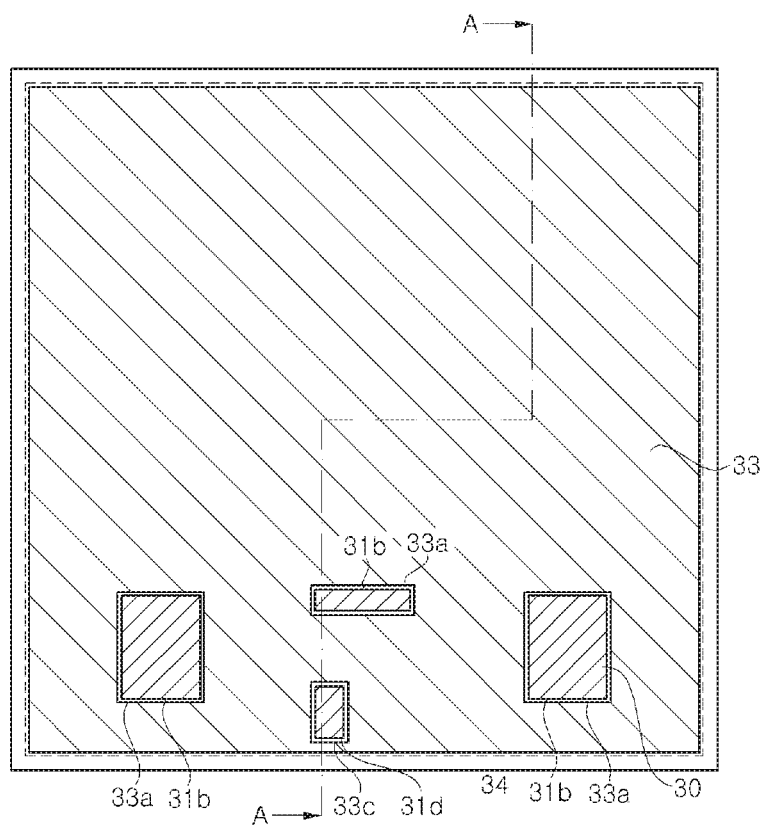
Figure 21B:
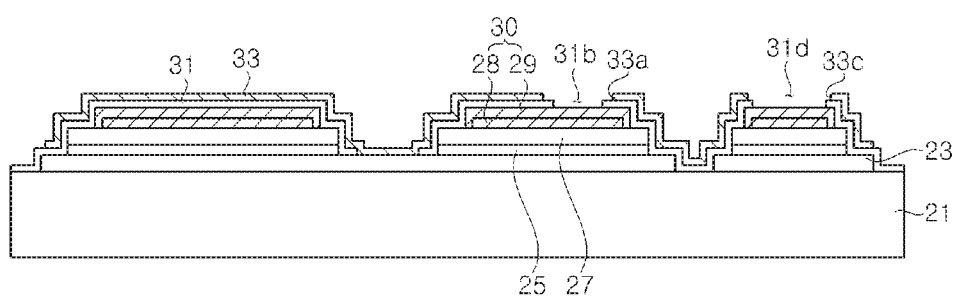

Referring to FIG. 21, as described with reference to FIG. 13, a current dispersion layer 33 is formed on the lower insulation layer 31. In addition, the current dispersion layer 33 covers the mesas M1 and the first conductive type semiconductor layer 23 in the light emitting diode part Ld, and has openings 33a which are placed within upper areas of the mesas M and expose the reflective electrodes 30, respectively. In addition, the current dispersion layer 33 covers one of the two diodes and has an opening 33c which expose the mesa M2 of the other diode.

With this structure, the first conductive type semiconductor layer 23 of the light emitting diode part Ld is electrically connected to one mesa M2 of the reverse-parallel diode part Bi-Rd through the current dispersion layer 33.

In the reverse parallel diode part Bi-Rd, since the two diodes share the first conductive type semiconductor layer 23 (cathode), a connection pattern for connecting the first conductive type semiconductor layers 23 can be omitted.

Figure 22A:
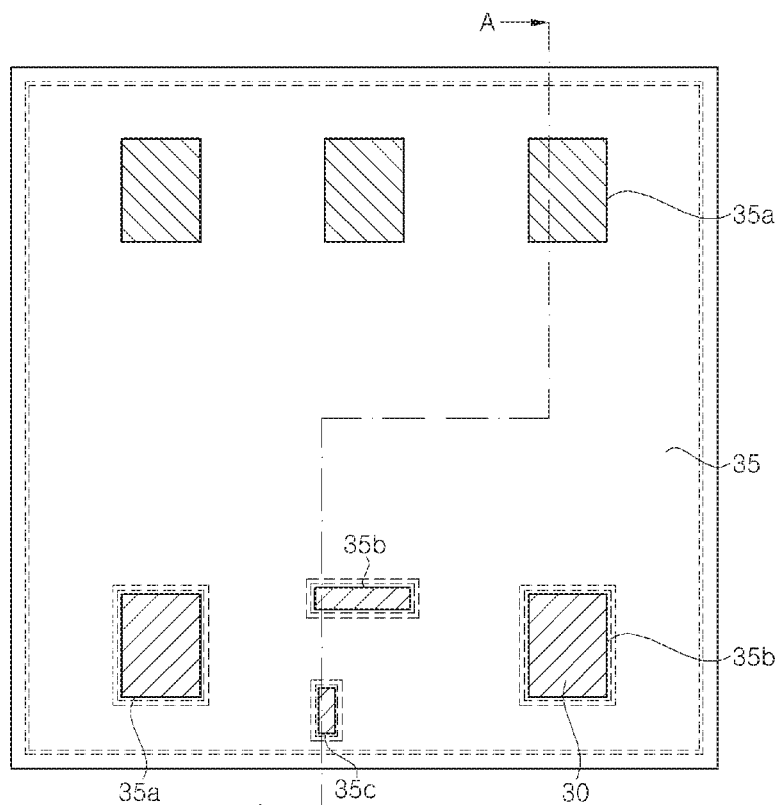
Figure 22B:
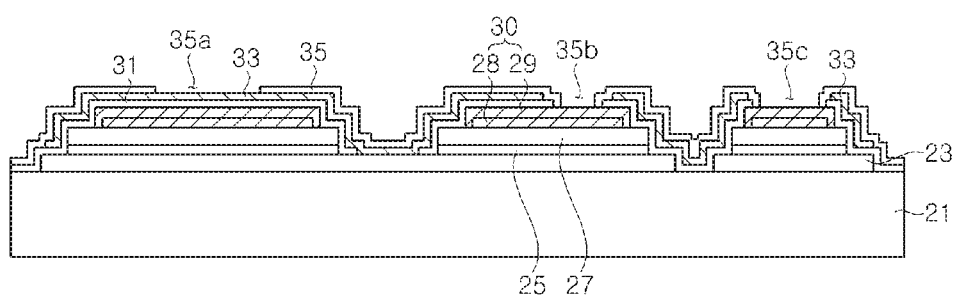

Referring to FIG. 22, as described with reference to FIG. 14, an upper insulation layer 35 is formed on the current dispersion layer 33. As described with reference to FIG. 14, in the light emitting diode part Ld, the upper insulation layer 35 has openings 35a which expose the current dispersion layer 33, and openings 35b which expose the reflective electrodes 30. In addition, as described with reference to FIG. 14, the upper insulation layer 35 has an opening 35c which exposes the other mesa M2 in the reverse-parallel diode part.

In this embodiment, the opening 35c exposes the reflective electrode 30, which is exposed through the opening 33c of the current dispersion layer 33 and through the opening 31d of the lower insulation layer 31. The opening 35c has a narrower area than the opening 33c of the current dispersion layer 33, whereby a sidewall of the opening 33c is covered by the upper insulation layer 35. The opening 35c may have a narrower or larger area than the opening 31d of the lower insulation layer 31.

Figure 23A:
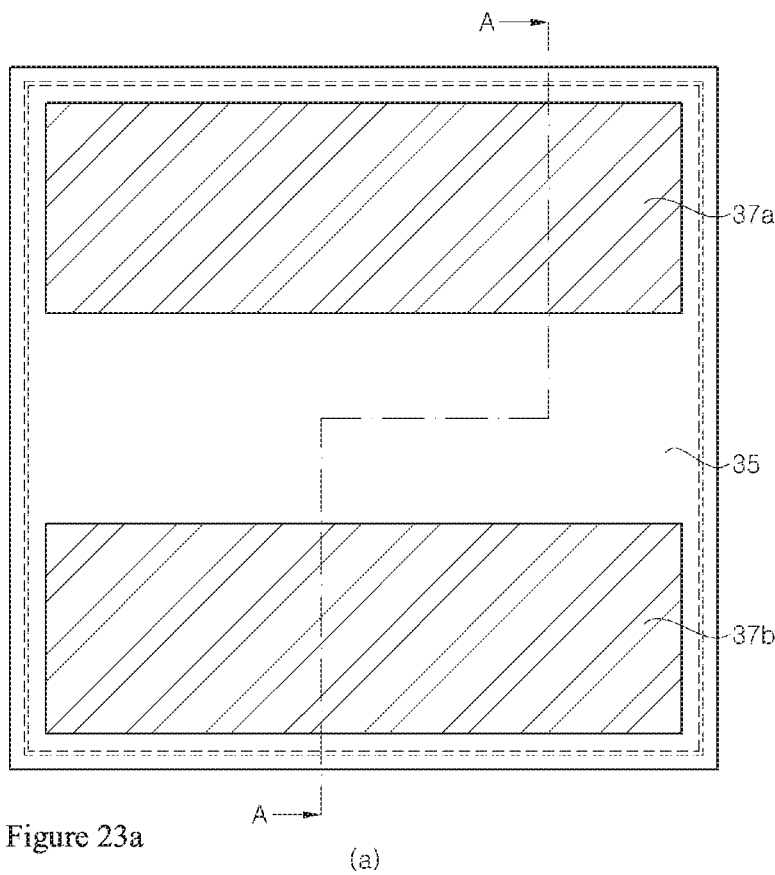
Figure 23B:
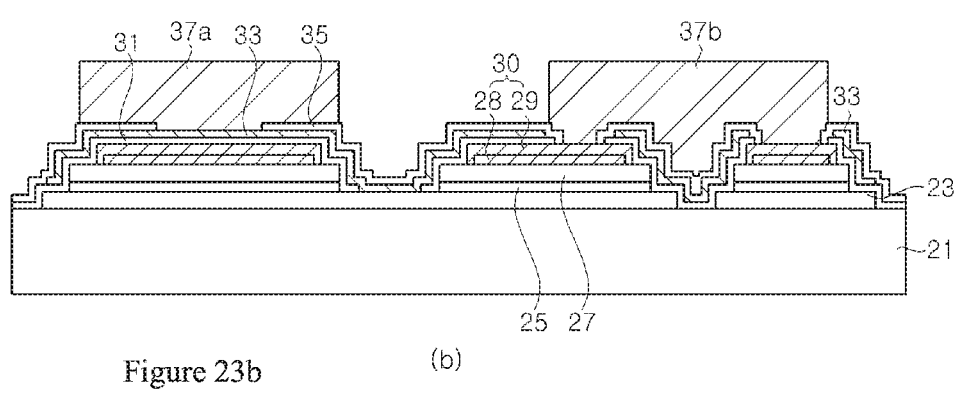

Referring to FIG. 23, as described with reference to FIG. 15, a first electrode 37a and a second electrode pad 37b are formed on the upper insulation layer 35.

The second electrode pad 37b is aligned or formed over the light emitting diode part and the reverse-parallel diode part, is connected to the reflective electrodes 30 through the openings 35b of the upper insulation layer 35, and is connected to the reflective electrode (M2) exposed through the opening 35c in the reverse-parallel diode part to be electrically connected to the mesa M2. With this structure, the second conductive type semiconductor layer 27 of the light emitting diode part is electrically connected to the second conductive type semiconductor layer 23 of the other diode of the reverse-parallel diode part through the second electrode pad 37b.

Then, the substrate 21 is divided into individual light emitting diode chip units, thereby providing final light emitting diode chips. Although the substrate 21 is illustrated as remaining on the flip-chip type light emitting diode chip in this embodiment, the substrate 21 may be removed from the light emitting diode chips before or after the division into individual light emitting diode chip units. Although the substrate 21 is illustrated as remaining on the flip-chip type light emitting diode chip in this embodiment, the substrate 21 may be removed from the light emitting diode chips before or after division into individual light emitting diode chip units.

Figure 24:
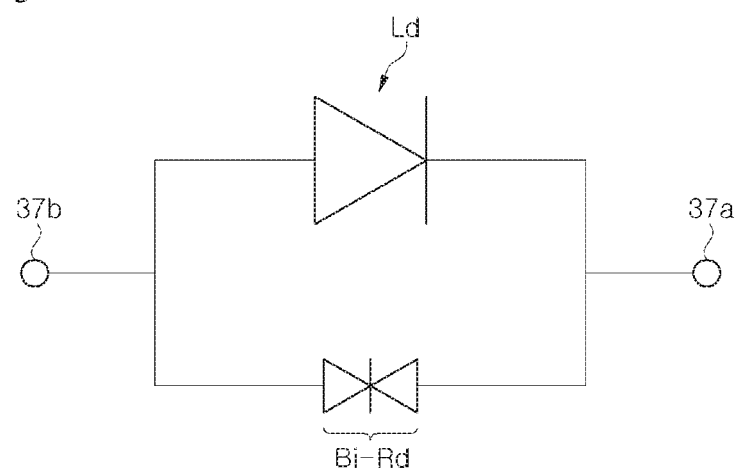
FIG. 24 is a schematic circuit diagram of the light emitting diode chip according to an exemplary embodiment of the disclosed technology.

FIG. 24 schematically shows a circuit diagram of the light emitting diode chip according to this embodiment. As shown in FIG. 24, the light emitting diode chip according to this embodiment includes the light emitting diode part Ld and the reverse-parallel diode part Bi-Rd between the first electrode pad 37a and the second electrode pad 37b, in which the reverse-parallel diode part Bi-Rd includes two diodes connected in opposite directions. In addition, the two diodes share a cathode.

According to the embodiments of the invention, since the light emitting diode chip includes a reverse-parallel diode part (Rd, Bi-Rd), there is no need for a separate ESD protection device such as a Zener diode for protecting components from electrostatic discharge. Accordingly, the disclosed technology can simplify a process of fabricating a light emitting diode chip by omitting a process of mounting the Zener diode and can enhance luminous efficacy of a light emitting diode package by preventing absorption of light by the Zener diode.

Although some embodiments have been described herein, it should be understood that the disclosed technology is not limited to certain embodiments. In addition, some features of a certain embodiment may also be applied to other embodiments in the same or similar ways without departing from the spirit and scope of the present invention

What is claimed is:

1. A flip-chip type light emitting diode chip comprising:
 a substrate;
 a light emitting diode part aligned on the substrate; a reverse-parallel diode part aligned on the substrate and connected to the light emitting diode part;
 an insulation layer covering the light emitting diode part and the reverse-parallel diode part;
 a first electrode pad aligned on the light emitting diode part; and
 a second electrode pad aligned over the light emitting diode part and the reverse-parallel diode part,
 wherein each of the light emitting diode part and the reverse-parallel diode part comprises;
 a first conductive type nitride-based semiconductor layer;
 a second conductive type nitride-based semiconductor layer; and
 an active layer placed between the first conductive type nitride-based semiconductor layer and the second conductive type nitride-based semiconductor layer, and wherein the first electrode pad is electrically connected to the first conductive type semiconductor layer of the light emitting diode part and the second conductive type semiconductor layer of the reverse-parallel diode part, and wherein the second electrode pad electrically connected to the first conductive type semiconductor layer of the reverse-parallel diode part and the second conductive type semiconductor layer of the light emitting diode part through the insulation layer.

2. The flip-chip type light emitting diode chip of claim 1, wherein the reverse-parallel diode part is located in the middle of an edge of the substrate.

3. The flip-chip type light emitting diode chip of claim 1, wherein the light emitting diode part is formed to surround at least a portion of the reverse-parallel diode part.

4. The flip-chip type light emitting diode chip of claim 1, wherein the reverse-parallel diode part has a polygonal shape having four sides and the light emitting diode part surrounds three sides of the reverse-parallel diode part.

5. The flip-chip type light emitting diode chip of claim 1, wherein the second electrode pad is electrically connected to the second conductive type semiconductor layer of the light emitting diode part and the first conductive type semiconductor layer of the reverse-parallel diode part.

6. The flip-chip type light emitting diode chip of claim 1, further comprising:
a reflective electrode aligned on the second conductive type nitride-based semiconductor layer of the light emitting diode part,
wherein the first electrode pad is placed on the reflective electrode.

7. The flip-chip type light emitting diode chip of claim 6, further comprising:
a current dispersion layer placed between the reflective electrode and the first electrode pad, and electrically connected to the first conductive type nitride-based semiconductor layer of the light emitting diode part and the second conductive type nitride-based semiconductor layer of the reverse-parallel diode part,
the current dispersion layer being insulated from the reflective electrode.

8. The flip-chip type light emitting diode chip of claim 7, wherein the current dispersion layer covers the light emitting diode part and the reverse-parallel diode part, and has an opening which exposes the reflective electrode on the light emitting diode part, and an opening which exposes the first conductive type nitride-based semiconductor layer of the reverse-parallel diode part.

9. The flip-chip type light emitting diode chip of claim 8, wherein the reflective electrode and the first conductive type nitride-based semiconductor layer exposed through the openings of the current dispersion layer are electrically connected to each other by the second electrode pad.

10. The flip-chip type light emitting diode chip of claim 1, wherein the reverse-parallel diode part comprises two diodes connected in opposite directions.

11. The flip-chip type light emitting diode chip of claim 10, wherein the two diodes are disposed such that cathodes of the two diodes face each other.

12. The flip-chip type light emitting diode chip of claim 10, wherein the two diodes share a cathode.

13. The flip-chip type light emitting diode chip of claim 10, further comprising:
a first electrode pad aligned on the light emitting diode part; and
a second electrode pad aligned over the light emitting diode part and the reverse-parallel diode part.

14. The flip-chip type light emitting diode chip of claim 13, wherein each of the light emitting diode part and the reverse-parallel diode part comprises:
a first conductive type nitride-based semiconductor layer;
a second conductive type nitride-based semiconductor layer; and
an active layer placed between the first conductive type nitride-based semiconductor layer and the second conductive type nitride-based semiconductor layer, and
wherein the first electrode pad is electrically connected to the first conductive type semiconductor layer of the light emitting diode part and the second conductive type semiconductor layer of one of the two diodes.

15. The flip-chip type light emitting diode chip of claim 14, wherein the second electrode pad is electrically connected to the second conductive type semiconductor layer of the light emitting diode part and the second conductive type semiconductor layer of the other one of the two diodes.

* * * * *